US011710623B2

(12) United States Patent
Drewery et al.

(10) Patent No.: US 11,710,623 B2
(45) Date of Patent: Jul. 25, 2023

(54) VACUUM PUMP PROTECTION AGAINST DEPOSITION BYPRODUCT BUILDUP

(71) Applicant: Lam Research Corporation, Fremont, CA (US)

(72) Inventors: John Stephen Drewery, San Jose, CA (US); Tom A. Kamp, San Jose, CA (US); Haoquan Yan, Fremont, CA (US); John Edward Daugherty, Fremont, CA (US); Ali Sucipto Tan, Milipitas, CA (US); Ming-Kuei Tseng, San Jose, CA (US); Bruce Freeman, Mountain House, CA (US)

(73) Assignee: Lam Research Corporation, Fremont, CA (US)

( * ) Notice: Subject to any disclaimer, the term of this patent is extended or adjusted under 35 U.S.C. 154(b) by 168 days.

(21) Appl. No.: 17/302,622

(22) Filed: May 7, 2021

(65) Prior Publication Data

US 2021/0257195 A1 Aug. 19, 2021

Related U.S. Application Data

(63) Continuation of application No. 16/584,095, filed on Sep. 26, 2019, now Pat. No. 11,031,215.
(Continued)

(51) Int. Cl.
*H01J 37/32* (2006.01)
*H01L 21/02* (2006.01)
(Continued)

(52) U.S. Cl.
CPC .... *H01J 37/32862* (2013.01); *C23C 16/0236* (2013.01); *C23C 16/4405* (2013.01);
(Continued)

(58) Field of Classification Search
CPC ........... H01J 37/32862; H01J 37/32449; H01J 37/32834; H01J 37/3211; H01J 37/32715;
(Continued)

(56) References Cited

U.S. PATENT DOCUMENTS 6,074,486 A 6/2000 Yang et al.
6,310,755 B1 10/2001 Kholodenko et al.
(Continued)

FOREIGN PATENT DOCUMENTS

CN 101921999 A 12/2010
CN 101922437 A 12/2010
(Continued)

OTHER PUBLICATIONS

Office Action dated Jun. 19, 2020 issued in U.S. Appl. No. 16/584,095.
(Continued)

*Primary Examiner* — Rudy Zervigon
(74) *Attorney, Agent, or Firm* — Weaver Austin Villeneuve & Sampson LLP

(57) ABSTRACT

A processing chamber such as a plasma etch chamber can perform deposition and etch operations, where byproducts of the deposition and etch operations can build up in a vacuum pump system fluidly coupled to the processing chamber. A vacuum pump system may have multiple roughing pumps so that etch gases can be diverted a roughing pump and deposition precursors can be diverted to another roughing pump. A divert line may route unused deposition precursors through a separate roughing pump. Deposition byproducts can be prevented from forming by incorporating one or more gas ejectors or venturi pumps at an outlet of a primary pump in a vacuum pump system. Cleaning operations, such as waferless automated cleaning operations, using certain clean chemistries may remove deposition byproducts before or after etch operations.

11 Claims, 14 Drawing Sheets

Related U.S. Application Data

(60) Provisional application No. 62/774,037, filed on Nov. 30, 2018, provisional application No. 62/738,852, filed on Sep. 28, 2018.

(51) Int. Cl.
*H01L 21/311* (2006.01)
*H01L 21/67* (2006.01)
*C23C 16/02* (2006.01)
*C23C 16/455* (2006.01)
*C23C 16/44* (2006.01)
*H01L 21/683* (2006.01)

(52) U.S. Cl.
CPC .. *C23C 16/45544* (2013.01); *H01J 37/32449* (2013.01); *H01J 37/32834* (2013.01); *H01L 21/0228* (2013.01); *H01L 21/02211* (2013.01); *H01L 21/31116* (2013.01); *H01L 21/67069* (2013.01); *H01J 37/3211* (2013.01); *H01J 37/32715* (2013.01); *H01J 2237/186* (2013.01); *H01J 2237/1825* (2013.01); *H01J 2237/3321* (2013.01); *H01J 2237/3341* (2013.01); *H01L 21/02164* (2013.01); *H01L 21/6833* (2013.01)

(58) Field of Classification Search
CPC ......... H01J 2237/1825; H01J 2237/186; H01J 2237/3321; H01J 2237/3341; C23C 16/0236; C23C 16/4405; C23C 16/45544; C23C 16/4412; H01L 21/02211; H01L 21/0228; H01L 21/31116; H01L 21/67069; H01L 21/02164; H01L 21/6833; H01L 21/67017; F04D 19/042; F04D 19/046; F04B 43/12; F04B 43/1253; F04B 43/1276
USPC ............ 417/477.6, 476, 477.1, 477.2, 477.3, 417/477.4; 118/715; 156/345.31–345.32
See application file for complete search history.

(56) References Cited

U.S. PATENT DOCUMENTS

| | | | |
|---|---|---|---|
| 6,440,864 B1 | 8/2002 | Kropewnicki et al. | |
| 6,462,928 B1 | 10/2002 | Shamouilian et al. | |
| 6,490,146 B2 | 12/2002 | Wang et al. | |
| 6,538,872 B1 | 3/2003 | Wang et al. | |
| 6,673,673 B1 | 1/2004 | Yang et al. | |
| 6,953,739 B2 | 10/2005 | Yang et al. | |
| 7,306,696 B2 | 12/2007 | Lian et al. | |
| 7,926,446 B2 | 4/2011 | Behle et al. | |
| 8,202,393 B2 | 6/2012 | Wong et al. | |
| 8,235,001 B2 | 8/2012 | Sano et al. | |
| 8,454,728 B2 | 6/2013 | Grant | |
| 9,355,886 B2 | 5/2016 | Swaminathan et al. | |
| 9,869,022 B2 | 1/2018 | Sawada | |
| 10,329,668 B2 | 6/2019 | Franken et al. | |
| 11,031,215 B2 | 6/2021 | Drewery et al. | |
| 11,114,283 B2* | 9/2021 | Blomberg | H01L 21/68757 |
| 11,155,916 B2* | 10/2021 | Huang | C23C 16/4408 |
| 2002/0144706 A1 | 10/2002 | Davis et al. | |
| 2003/0074954 A1 | 4/2003 | Engle et al. | |
| 2003/0129835 A1 | 7/2003 | Kholodenko et al. | |
| 2003/0173020 A1 | 9/2003 | Ishiyama | |
| 2004/0094091 A1 | 5/2004 | Yang et al. | |
| 2005/0217993 A1 | 10/2005 | Gebele et al. | |
| 2009/0120464 A1 | 5/2009 | Rasheed et al. | |
| 2009/0188524 A1 | 7/2009 | New et al. | |
| 2010/0071548 A1 | 3/2010 | Smith | |
| 2010/0071549 A1 | 3/2010 | Grant | |
| 2010/0215513 A1 | 8/2010 | Kim et al. | |
| 2011/0265884 A1 | 11/2011 | Xu et al. | |
| 2011/0265951 A1 | 11/2011 | Xu et al. | |
| 2014/0134827 A1 | 5/2014 | Swaminathan et al. | |
| 2015/0292083 A1 | 10/2015 | Franken et al. | |
| 2016/0002787 A1 | 1/2016 | Sawada | |
| 2016/0254171 A1 | 9/2016 | Shamma et al. | |
| 2017/0122298 A1 | 5/2017 | Asai | |
| 2017/0200622 A1 | 7/2017 | Shiokawa et al. | |
| 2017/0350395 A1 | 12/2017 | Schofield et al. | |
| 2018/0003178 A1 | 1/2018 | Schofield et al. | |
| 2018/0061679 A1 | 3/2018 | Silveira et al. | |
| 2018/0274615 A1 | 9/2018 | Fiala et al. | |
| 2019/0043728 A1 | 2/2019 | Zhou et al. | |
| 2020/0027763 A1 | 1/2020 | Gosen et al. | |
| 2020/0047225 A1 | 2/2020 | Bailey et al. | |
| 2020/0105509 A1 | 4/2020 | Brewery et al. | |
| 2023/0034561 A1 | 2/2023 | Hsu et al. | |

FOREIGN PATENT DOCUMENTS

| | | |
|---|---|---|
| JP | 2005/180279 | 7/2005 |
| KR | 10-0498467 B1 | 7/2005 |
| KR | 10-1293653 B1 | 8/2013 |
| KR | 10-1862806 B1 | 5/2018 |
| WO | WO 2007/132259 | 11/2007 |
| WO | WO 2020/069206 | 4/2020 |

OTHER PUBLICATIONS

Final Office Action dated Oct. 16, 2020 issued in U.S. Appl. No. 16/584,095.
Notice of Allowance dated Feb. 10, 2021 issued in U.S. Appl. No. 16/584,095.
Notice of Allowance dated Mar. 3, 2021 issued in U.S. Appl. No. 16/584,095.
International Search Report and Written Opinion dated dated Jan. 13, 2020 issued in Application No. PCT/US2019/053279.
International Preliminary Report on Patentability dated Apr. 8, 2021 issued in Application No. PCT/US2019/053279.

* cited by examiner

VACUUM PUMP PROTECTION AGAINST DEPOSITION BYPRODUCT BUILDUP

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Vacuum pumps are widely used in semiconductor processing equipment to provide a clean and/or low-pressure environment in a processing chamber. Such vacuum pumps may be fluidly connected to the processing chamber to remove byproducts and unused etch and deposition precursors. Some vacuum pumps may be vulnerable to undesirable buildup of byproducts from mixing of etch and deposition precursors that can corrode or otherwise degrade the vacuum pumps over time.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is an apparatus including a processing chamber, an etch gas delivery system configured to introduce one or more etch gases into the processing chamber, a deposition precursor delivery system configured to introduce one or more deposition precursors into the processing chamber, and a vacuum pump system in fluid communication with the processing chamber. The vacuum pump system includes a first roughing pump, a second roughing pump, and a turbomolecular pump, the turbomolecular pump being in fluid communication with one or both of the first roughing pump and the second roughing pump.

In some implementations, the vacuum pump system is configured to direct the one or more etch gases through the first roughing pump and direct the one or more deposition precursors through the second roughing pump. In some implementations, the vacuum pump system further includes a foreline in fluid communication with the processing chamber and configured to receive the one or more etch gases and the one or more deposition precursors from the processing chamber, and a valve coupled to the foreline and configured to direct the one or more etch gases through the first roughing pump in a first position, and configured to direct the one or more deposition precursors through the second roughing pump in a second position. In some implementations, the vacuum pump system further includes a divert line in fluid communication with the deposition precursor delivery system, where the divert line is configured to divert unused deposition precursors in a deposition cycle from the deposition precursor delivery system through the second roughing pump. In some implementations, the one or more etch gases include hydrogen bromide (HBr) and the one or more deposition precursors include an amino-silane precursor.

Another aspect of the present disclosure involves a vacuum pump system for exhausting one or more etch gases and one or more deposition precursors from a processing chamber. The vacuum pump system includes a first roughing pump for receiving the one or more etch gases from the processing chamber, and a second roughing pump for receiving the one or more deposition precursors from the processing chamber, where one or both of the first and the second roughing pump is configured to be in fluid communication with a turbomolecular pump.

In some implementations, the vacuum pump system further includes a foreline in fluid communication with the processing chamber and configured to receive the one or more etch gases and the one or more deposition precursors from the processing chamber, and a valve coupled to the foreline and configured to direct the one or more etch gases through the first roughing pump in a first position, and configured to direct the one or more deposition precursors through the second roughing pump in a second position.

Another aspect of the present disclosure involves a vacuum pump system for exhausting one or more etch gases and one or more deposition precursors from the processing chamber. The vacuum pump system includes a first roughing pump for receiving the one or more etch gases and the one or more deposition precursors from the processing chamber, and a second roughing pump for receiving unused deposition precursors in a deposition cycle, where one or both of the first and the second roughing pump is configured to be in fluid communication with a turbomolecular pump.

In some implementations, the vacuum pump system is configured to direct the one or more etch gases and the one or more deposition precursors through the first roughing pump, and direct unused deposition precursors in the deposition cycle through the second roughing pump. In some implementations, the vacuum pump system further includes a divert line in fluid communication with a deposition precursor delivery system, wherein the divert line is configured to divert the unused deposition precursors in the deposition cycle from the deposition precursor delivery system through the second roughing pump. In some implementations, the one or more etch gases include hydrogen bromide (HBr) and the one or more deposition precursors include an amino-silane precursor.

Another aspect of the present disclosure involves a method of cleaning a vacuum pump system. The method includes performing one or more deposition operations on a wafer in a processing chamber, performing one or more etch operations on the wafer in the processing chamber, and performing a cleaning operation using reactive gases that flow through the vacuum pump system, the cleaning operation being performed before or after the one or more etch operations, where the vacuum pump system is in fluid communication with the processing chamber.

In some implementations, performing the cleaning operation occurs between a deposition operation and an etch operation. In some implementations, performing the one or more deposition operations, the one or more etch operations, and the cleaning operation occur with a wafer in the processing chamber. In some implementations, performing the cleaning operation occurs without a wafer in the processing chamber. In some implementations, the reactive gases include nitrogen trifluoride (NF3), sulfur hexafluoride ($SF_6$), carbon tetrafluoride (CF4), chlorine trifluoride (ClF3), chlorine ($Cl_2$), oxygen ($O_2$), ozone ($O_3$), or combinations thereof. In some implementations, the reactive gases includes ozone. In some implementations, the method further includes generating the reactive gases in-situ in the processing chamber by a plasma reaction. In some implementations, the method further includes generating the reactive gases by a plasma source located in a foreline, where the foreline provides interconnection between the vacuum pump system and the processing chamber. In some implementations, the method further includes generating the reactive gases by a remote plasma source located outside a foreline, wherein the foreline provides interconnection between the vacuum pump system and the processing chamber.

Another aspect of the present disclosure involves a vacuum pump system for exhausting one or more etch gases and one or more deposition gases from a processing chamber. The vacuum pump system includes a roughing pump through which deposition precursors and etch gases are exhausted from the processing chamber, a gas ejector connected in series with the roughing pump and positioned downstream from the roughing pump, where the gas ejector is configured to reduce a pressure at an outlet of the roughing pump.

In some implementations, the gas ejector is a venturi pump connected to the outlet of the roughing pump, where the venturi pump is configured to flow injection gas a body of the venturi pump and mixes with the exhausted deposition precursors and etch gases in the body of the venturi pump. In some implementations, the injection gas includes inert gas, clean dry air, or nitrogen gas ($N_2$). In some implementations, the vacuum pump system further includes an abatement component configured to treat the deposition precursors and exhaust gases, where the gas ejector is positioned between the abatement component and the roughing pump.

DETAILED DESCRIPTION

Figure 1A:
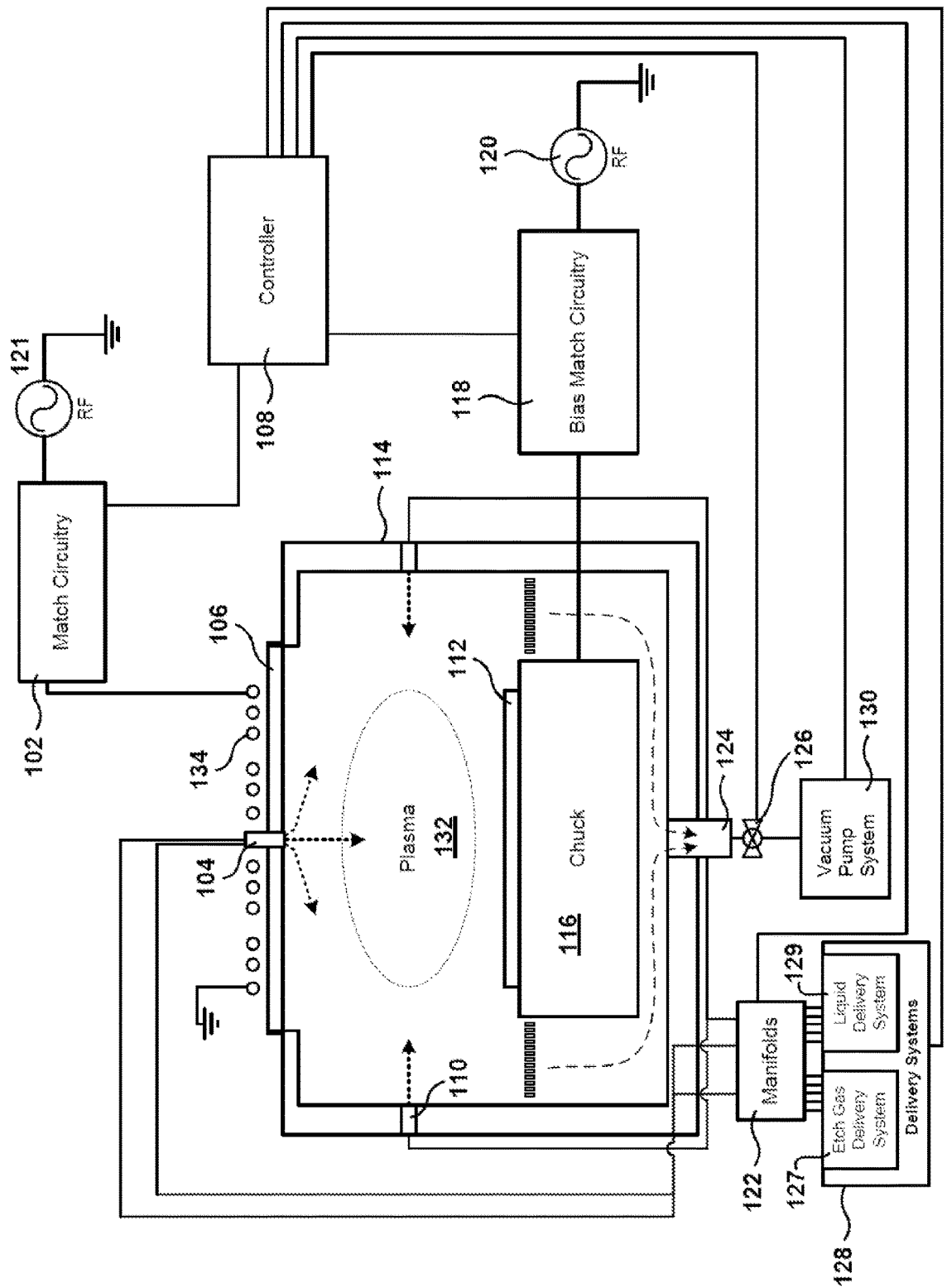
FIG. 1A is a schematic diagram of an example processing apparatus for performing etch and deposition operations according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Conventionally, deposition and etch processes are performed on separate tools or platforms. For example, deposition chambers generally do not run etch processes, and etch chambers generally do not run deposition processes. In some embodiments, an apparatus can be configured to perform deposition and etch processes in a single processing chamber. For example, atomic layer deposition (ALD) processes and etch processes may be performed in a processing chamber such as a plasma etch chamber. In performing both ALD processes and etch processes on a wafer in the processing chamber, deposition precursors and etch gases flow through the processing chamber and may be exhausted through a vacuum pump system.

Unreacted deposition precursors and etch gases may be exhausted by a vacuum pump system fluidly coupled to the processing chamber. The unreacted deposition precursors and etch gases may mix and form undesirable byproducts in the vacuum pump system that can damage pump equipment. In some instances, deposition byproducts may build up in a roughing pump of the vacuum pump system, where the deposition byproducts degrade the roughing pump, thereby reducing its performance and lifetime. Without being limited by any theory, a process chemical (e.g., deposition precursor, etch gas, or reaction product) is retained in the roughing pump following a deposition or etch operation, a chemical reaction follows with the retained chemical, and the same process chemical is flowed through the roughing pump. For example, an acid gas such as hydrogen bromide (HBr) may react with iron components of the roughing pump to form an iron bromide, a Lewis acid catalyst. When subsequently exposed to a deposition precursor such as an amino-silane precursor gas, a number of reactions may follow that result in a deposition byproduct that has a lower volatility than the original amino-silane precursor gas. Accumulation of the deposition byproduct in the pump can lead to early failure of the pump. In some instances, the deposition byproduct can be a dark tar-like substance. The accumulation of the deposition byproduct reduces the utility of using deposition precursors and etch gases together in a single processing chamber.

The present disclosure relates to methods and apparatuses for removing deposition byproducts from a vacuum pump system or preventing deposition byproducts from forming in the vacuum pump system. In some embodiments, deposition and etch gases may be exhausted separately through separate pumps in fluid communication with the processing chamber. In some embodiments, a pump may have multiple inlets for the pump to access the processing chamber depending on the pump's operating pressure. In some embodiments, internal surfaces of a pump are heated to an elevated temperature to vaporize deposition byproduct or prevent surface reactions that form the deposition byproduct. In some embodiments, internal surfaces of a pump are coated with a corrosion-resistant material to prevent or minimize surface reactions that would otherwise form the deposition byproduct. In some embodiments, purge times are determined so that purging operations performed between deposition and etch operations are rendered sufficient for removing etch gases and deposition precursors from the vacuum pump system. In some embodiments, a cleaning operation may use reactive gases to remove deposition byproducts or remove deposition/etch gases from the vacuum pump system. Clean chemistries may involve oxygen, ozone, or combinations thereof. Clean chemistries may involve fluorine-containing species, chlorine-containing species, bromine-containing species, iodine-containing species, or combinations thereof. In some embodiments, one or more gas ejectors or venturi pumps may be provided downstream from the roughing pump to reduce exhaust pressure at an outlet of the roughing pump. In some embodiments, a plurality of gas ejectors or venturi pumps may serve as a primary pump for creating at least a "rough" vacuum in the processing chamber. One or more of the aforementioned embodiments may be combined together to prevent deposition byproduct buildup.

Integrated Etch/Deposition Apparatus

FIG. 1A is a schematic diagram of an example processing apparatus for performing etch and deposition operations according to some implementations. The processing apparatus 100 may be an inductively coupled plasma processing apparatus. The processing apparatus 100 includes a plasma chamber 132 such as a plasma etch chamber. In some implementations, a Kiyo™ reactor, produced by Lam Research Corporation of Fremont, Calif., is an example of a suitable reactor that may be used as the plasma etch chamber.

Details regarding the processing apparatus 100 for performing etch and deposition operations are described in U.S. patent application Ser. No. 15/669,871, filed Aug. 4, 2017 to Zhou et al., and entitled "INTEGRATED ATOMIC LAYER PASSIVATION IN TCP ETCH CHAMBER AND IN-SITU ETCH-ALP METHOD," which is incorporated by reference in its entirety and for all purposes.

The plasma chamber 132 may include an overall chamber structure that may be defined by chamber walls 114 and a window 106. The window 106 may be fabricated from quartz or other dielectric material. In some implementations, the plasma chamber 132 includes a substrate support 116 disposed inside the plasma chamber 132. In some implementations, the substrate support 116 is an electrostatic chuck for supporting a substrate 112 upon which a deposition/etch process is performed. The electrostatic chuck may include electrostatic electrodes for chucking and dechucking the substrate 112. A filter and DC clamp power supply (not shown) may be provided for this purpose. Other control systems for lifting the substrate 112 off the substrate support 116 may also be provided. The substrate support 116 is configured to receive and hold the substrate 112.

In some implementations, the substrate support 116 may include a heater (not shown) to heat the substrate 112. The substrate support 116 may operate at elevated temperatures, such as between about −20° C. and about 150° C. The temperature will depend on the process operation and specific recipe. In some implementations, the plasma chamber 132 may also operate at certain pressures, such as pressures in between about 1 mTorr and about 1 Torr.

In some implementations, the processing apparatus 100 may include a radio-frequency (RF) power supply 120 that may be used for biasing/charging the substrate support 116. The RF power supply 120 may be defined by one or more RF generators. If multiple RF generators are provided, different frequencies may be used to achieve various tuning characteristics. A bias matching circuitry 118 is coupled between the RF power supply 120 and the substrate support 116. In this manner, the RF power supply 120 is connected to the substrate support 116.

A coil 134 is positioned over the window 106. The coil 134 may be fabricated from an electrically conductive material and includes at least one complete turn. The coil 134 shown in FIG. 1A includes at least three turns. An RF power supply 121 is configured to supply RF power to the coil 134. A matching circuitry 102 is coupled between the RF power supply 121 and the coil 134. In this manner, the RF power supply 121 is connected to the coil 134. In some implementations, an optional Faraday shield (not shown) is positioned between the coil 134 and the window 106. The Faraday shield may be maintained in a spaced apart relationship relative to the coil 134. The Faraday shield may be disposed immediately above the window 106. The Faraday shield may prevent metal or other species from depositing on the window 106 of the plasma chamber 132.

RF power is supplied from the RF power supply 121 to the coil 134 to cause an RF current to flow through the coil 134. The RF current flowing through the coil 134 may generate an electromagnetic field about the coil 134. The electromagnetic field generates an inductive current within the plasma chamber 132 that acts on the gas(es) present in the plasma chamber 132 to produce a plasma. Various ions and/or radicals from the plasma may interact with the substrate 112 to perform a deposition or etch operation.

In some implementations, the processing apparatus 100 optionally includes a plasma grid (not shown) that may be used to divide the plasma chamber 132 into an upper portion and a lower portion. The plasma grid may be used to limit the amount of hot electrodes into the lower portion of the plasma chamber 132. In some implementations, the processing apparatus 100 is designed to operate such that plasma present in the lower portion of the plasma chamber 132 is an ion-ion plasma and the plasma present in the upper portion of the plasma chamber 132 is an electron-ion plasma.

Process gases may be introduced into the plasma chamber 132 through a first gas injector 104 from the top of the plasma chamber 132 and/or through a second gas injector 110 from the side of the plasma chamber 132. Process gases may include vaporized liquid precursors or vaporized solid precursors, which may be vaporized in a solid source evaporator (not shown) upstream of the processing apparatus 100. One or more reactant gases may be supplied through the first gas injector 104 and/or second gas injector 110. In some implementations, the gas injectors 104, 110 may be replaced by showerheads. It will be understood that additional or other gas supplies may be provided for supplying different gases to the plasma chamber 132 for various types of operations.

The various ways of injecting gas(es) into the plasma chamber 132 show that process gases, vaporized liquid precursors, and/or vaporized solid precursors may be provided into the plasma chamber 132 from various locations. In some implementations, only the first gas injector 104 is used. In some other implementations, only the second gas injector 110 is used. In some other implementations, both the first gas injector 104 and the second gas injector 110 are used. In some implementations, manifolds 122 control which gases are supplied to each of the different gas lines. Manifolds 122 allow for any type of gas (reactant, carrier, precursor, etc.) to be provided from any of the different gas lines. In some implementations, carrier gases can include gases such as oxygen ($O_2$), nitrogen ($N_2$), and helium (He). The gases may be introduced into the plasma chamber 132 without mixing or may be mixed with other gases before introduction into the plasma chamber 132.

Manifolds 122 may be used for selecting, switching, and/or mixing outputs from respective delivery systems in a delivery system 128. The delivery system 128 may, in some implementations, include an etch gas delivery system 127 and a deposition precursor delivery system 129. The etch gas delivery system 127 may be configured to output etch gases. Examples of etch gases include but are not limited to chlorine ($Cl_2$), hydrogen bromide (HBr), and sulfur hexafluoride ($SF_6$). The deposition precursor delivery system 129 may be configured to provide liquid precursor that is vaporized and delivered in vapor form in a deposition process such as an ALD process. Thus, a deposition precursor may be introduced into the plasma chamber 132 and may adsorb onto a surface of the substrate 112. The adsorbed precursor may be converted to form an adsorption-limited amount of film using a plasma. In some embodiments, the deposition precursor includes an amino-silane precursor. An example deposition precursor may have a chemical composition of the formula: $C_xH_yN_zO_aSi_b$.

A vacuum pump system 130 is connected to the plasma chamber 132 and may be used to draw out process gases from the plasma chamber 132 and to maintain a certain pressure within the plasma chamber 132. A valve 126 may be disposed between an exhaust 124 and the vacuum pump system 130 to control the amount of vacuum suction being applied to the plasma chamber 132. In some implementations, the vacuum pump system 130 can include a one or two stage mechanical dry pump and/or turbomolecular pump. In some implementations, the vacuum pump system 130 may be activated after each time a deposition or etch operation is completed to purge the plasma chamber 132. An example of a vacuum pump system 130 is further described in FIG. 1B. The vacuum pump system 130 is fluidly connected to the plasma chamber 132 and may serve to remove etch gases, deposition precursors, and reaction byproducts from the plasma chamber 132.

The processing apparatus 100 may be coupled to facilities (not shown) when installed in a clean room or a fabrication facility. Facilities include plumbing that provide processing gases, vacuum, temperature control, and environmental particle control. These facilities may be coupled to the processing apparatus 100 when installed in the target fabrication facility. Additionally, the processing apparatus 100 may be coupled to a transfer chamber that allows robotics to transfer substrates into and out of the plasma chamber 132 using automation.

The processing apparatus 100 may further include a system controller 108. The system controller 108 (which may include one or more physical or logical controllers) controls some or all of the operations of the processing apparatus 100. The system controller 108 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 108 they may be provided over a network. In certain implementations, the system controller 108 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the substrate (which in various implementations may be zero), the frequency and power applied to coils or other plasma generation components, substrate position, substrate movement speed, and other parameters of a particular process performed by the tool. The system control software may further control heating operations, purge operations, and cleaning operations through the vacuum pump system 130. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 108. The instructions for setting process conditions for a phase may be included in a corresponding recipe phase, for example. In some implementations, the recipe phases may be sequentially arranged, such that steps in a doping process are executed in a certain order for that process phase. For example, a recipe may be configured to perform etch operations and include one or more cycles of an ALD process performed in between each of the etch operations. The recipe may be configured to perform purge operations and/or clean operations between etch operations and the one or more cycles of the ALD process.

In some implementations, the system controller 108 is configured with instructions for performing one or more of the following operations: perform an etch operation on a substrate 112 in a plasma chamber 132 using one or more etch gases from an etch gas delivery system 127; and perform a deposition operation on the substrate 112 in the plasma chamber 132 using one or more deposition precursors from a deposition precursor delivery system 129. The system controller 108 may be further configured with instructions for performing the following operation: exhaust the one or more etch gases and the one or more deposition precursors from the plasma chamber 132 using a vacuum pump system 130. The system controller 108 may be further configured with instructions for performing the following operation: heat surfaces of a pump of the vacuum pump system 130 to an elevated temperature. The system controller 108 may be further configured with instructions for performing the following operation: purge the one or more etch gases or the one or more deposition precursors from the vacuum pump system 130 according to a purge time determined by residual gas analysis (RGA) or Fourier Transform Infrared (FTIR) gas analysis. The system controller 108 may be further configured with instructions for performing the following operation: perform a clean operation using reactive gases that flow through the vacuum pump system 130 before or after the etch operation.

Other computer software and/or programs may be employed in some embodiments. Examples of programs or sections of programs for this purpose include substrate positioning program, a process gas composition control program, a pressure control program, a heater control program, and an RF power supply control program.

In some cases, the system controller 108 controls gas concentration, substrate movement, and/or the power supplied to the coil 134 and/or substrate support 116. The system controller 108 may control the gas concentration by, for example, opening and closing relevant valves to produce one or more inlet gas stream that provide the necessary reactant(s) at the proper concentration(s). The substrate movement may be controlled by, for example, directing a substrate positioning system to move as desired. The power supplied to the coil 134 and/or substrate support 116 may be controlled to provide particular RF power levels. If a grid is used, the RF powers may be adjusted by the system controller 108 to create an electron-ion plasma in an upper portion of the plasma chamber 132 and ion-ion plasma in a lower portion of the plasma chamber 132. Further, the system controller 108 may be configured to supply power to the substrate support 116 under conditions such that an electron-ion plasma does not form in the lower portion of the plasma chamber 132.

The system controller 108 may control these and other aspects based on sensor output (e.g., when power, potential, pressure, gas levels, etc. reach a certain threshold), the timing of an operation (e.g., opening valves at certain times in a process, purging, etc.), or based on received instructions from the user.

In some implementations, a system controller 108 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 108, depending on the processing requirements and/or the type of system, may be programmed to control any of the processes disclosed herein, including the delivery of etch gases and deposition precursors into the plasma chamber 132, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool, purging of gases and byproducts from the plasma chamber 132, purging of gases and byproducts from the vacuum pump system 130, heating of surfaces of components of the vacuum pump system 130, and cleaning of the vacuum pump system 130 with reactive gases.

Broadly speaking, the system controller 108 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 108 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller 108, in some implementations, may be a part of or coupled to a computer that is integrated with, coupled to the system, otherwise networked to the system, or a combination thereof. For example, the system controller 108 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 108 receives instructions in the form of data, which specify parameters for each of the processing steps to be performed during one or more operations. It should be understood that the parameters may be specific to the type of process to be performed and the type of tool that the system controller 108 is configured to interface with or control. Thus as described above, the system controller 108 may be distributed, such as by comprising one or more discrete controllers that are networked together and working towards a common purpose, such as the processes and controls described herein. An example of a distributed system controller 108 for such purposes would be one or more integrated circuits on a chamber in communication with one or more integrated circuits located remotely (such as at the platform level or as part of a remote computer) that combine to control a process on the chamber.

As noted above, depending on the process step or steps to be performed by the tool, the system controller 108 might communicate with one or more of other tool circuits or modules, other tool components, cluster tools, other tool interfaces, adjacent tools, neighboring tools, tools located throughout a factory, a main computer, another system controller 108, or tools used in material transport that bring containers of substrates to and from tool locations and/or load ports in a semiconductor manufacturing factory.

Vacuum Pump System

Figure 1B:
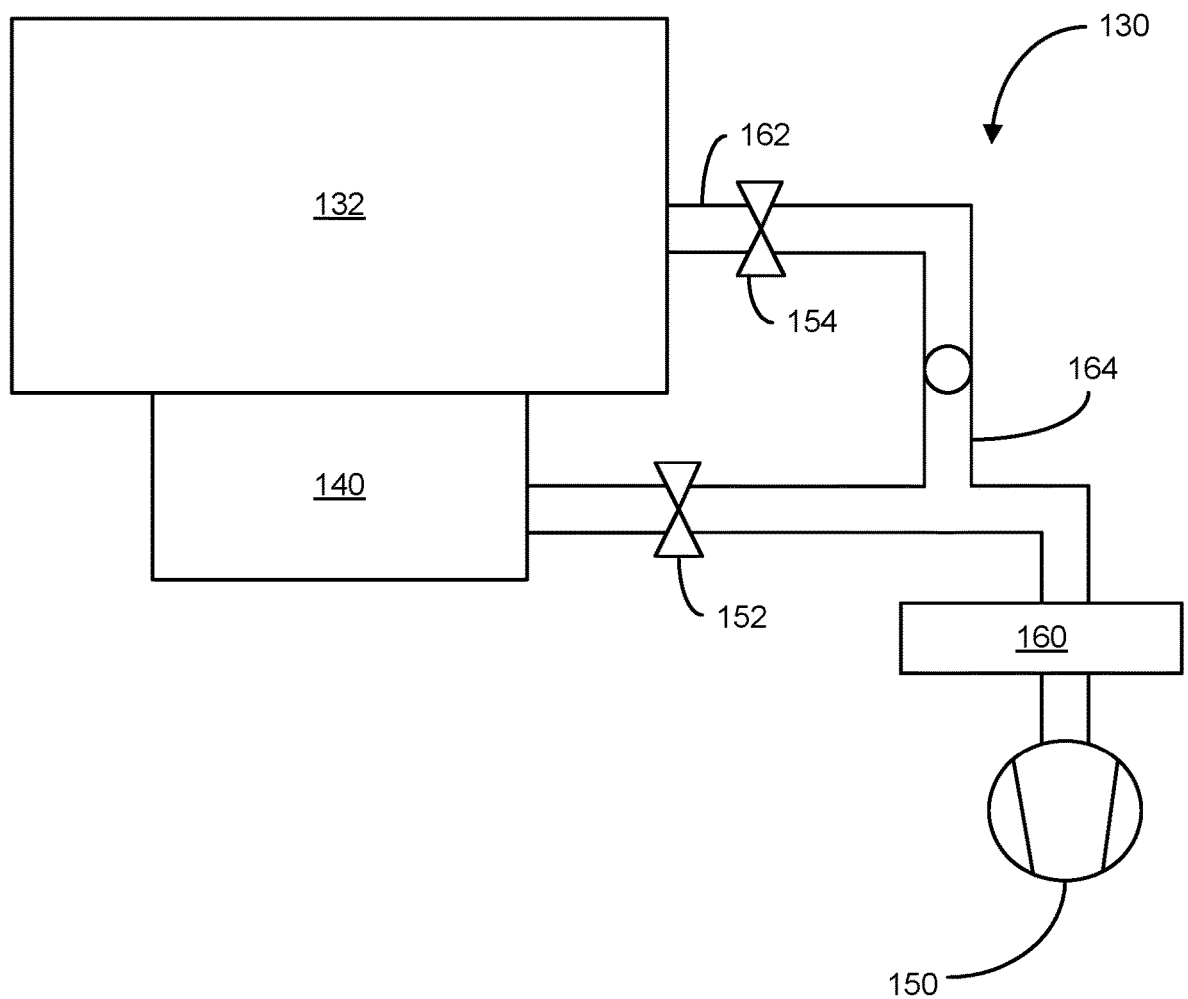
FIG. 1B is a schematic diagram of an example vacuum pump system including a roughing pump used in series with a turbomolecular pump according to some implementations.

FIG. 1B is a schematic diagram of an example vacuum pump system including a roughing pump used in series with a turbomolecular pump according to some implementations. However, it will be appreciated that the vacuum pump system 130 of the present disclosure may include different pump(s) and pump components than what is shown in FIG. 1B. A vacuum pump system 130 is in fluid communication with a processing chamber 132 such as a plasma chamber as described above. The vacuum pump system 130 may control chamber pressure in the processing chamber 132. The vacuum pump system 130 may remove byproducts, unreacted deposition precursors, and unreacted etch gases from the processing chamber 132. The vacuum pump system 130 may include multiple pumps that operate over varying pressure ranges. As shown in FIG. 1B, the vacuum pump system 130 includes a turbomolecular pump 140 and a roughing pump 150, where the roughing pump 150 is configured to produce a "rough" vacuum and the turbomolecular pump 140 is configured to follow to produce a very high vacuum. For example, the turbomolecular pump 140 may be configured to produce a vacuum pressure that is in the very high range (e.g., between about 1 mTorr and about 1 Torr) in the processing chamber 132, and the roughing pump 150 may be configured to produce a vacuum pressure that is in the relatively low range (e.g., between about 1 Torr and atmosphere) in the processing chamber 132. The roughing pump 150 may also be referred to as a "backing pump" or a "primary pump." For example, the roughing pump 150 may include a one or two stage mechanical dry pump.

The roughing pump 150 may be positioned downstream from the turbomolecular pump 140. In some implementations, a booster pump 160 is optionally provided between the turbomolecular pump 140 and the roughing pump 150, where the booster pump 160 can produce vacuum pressure that is in a range intermediate between the turbomolecular pump 140 and the roughing pump 150. In some implementations, the booster pump 160 may be considered part of the roughing pump 150 of the vacuum pump system 130. In some implementations, the booster pump 160 may be considered separate from the roughing pump system. In some implementations, the booster pump 160 includes a blower such as a Roots-type blower. The roughing pump 150 and/or booster pump 160 may be connected in series with the turbomolecular pump 140 to operate the chamber pressure across a large vacuum pressure range.

A first valve 152 may be disposed between the turbomolecular pump 140 and the roughing pump 150. The first valve 152 may be controlled to permit process gases to be exhausted from the turbomolecular pump 140 to the roughing pump 150. A second valve 154 may be disposed between an exhaust port 162 connected to the processing chamber 132 and the roughing pump 150. The second valve 154 may be controlled to permit process gases to be exhausted via the exhaust port 162 to a foreline 164. The foreline 164 connects the roughing pump 150 to the exhaust port 162.

Separate Pumps or Multi-Inlet Pump

Etch gases and deposition precursors may be prevented from mixing in a pump by diverting the etch gases and deposition precursors to separate pumps. As a result, deposition byproducts are prevented or otherwise limited from accumulating in any single pump. In some embodiments, a vacuum pump system may be designed with at least two separate roughing pumps. In some embodiments, each of the at least two roughing pumps may include booster pumps or blowers. In some embodiments, each of the at least two roughing pumps may include rotor components such as rotary vanes. As described below, a vacuum pump system may operate according to a "full divert" scheme or a "bypass divert" scheme.

Figure 2A:
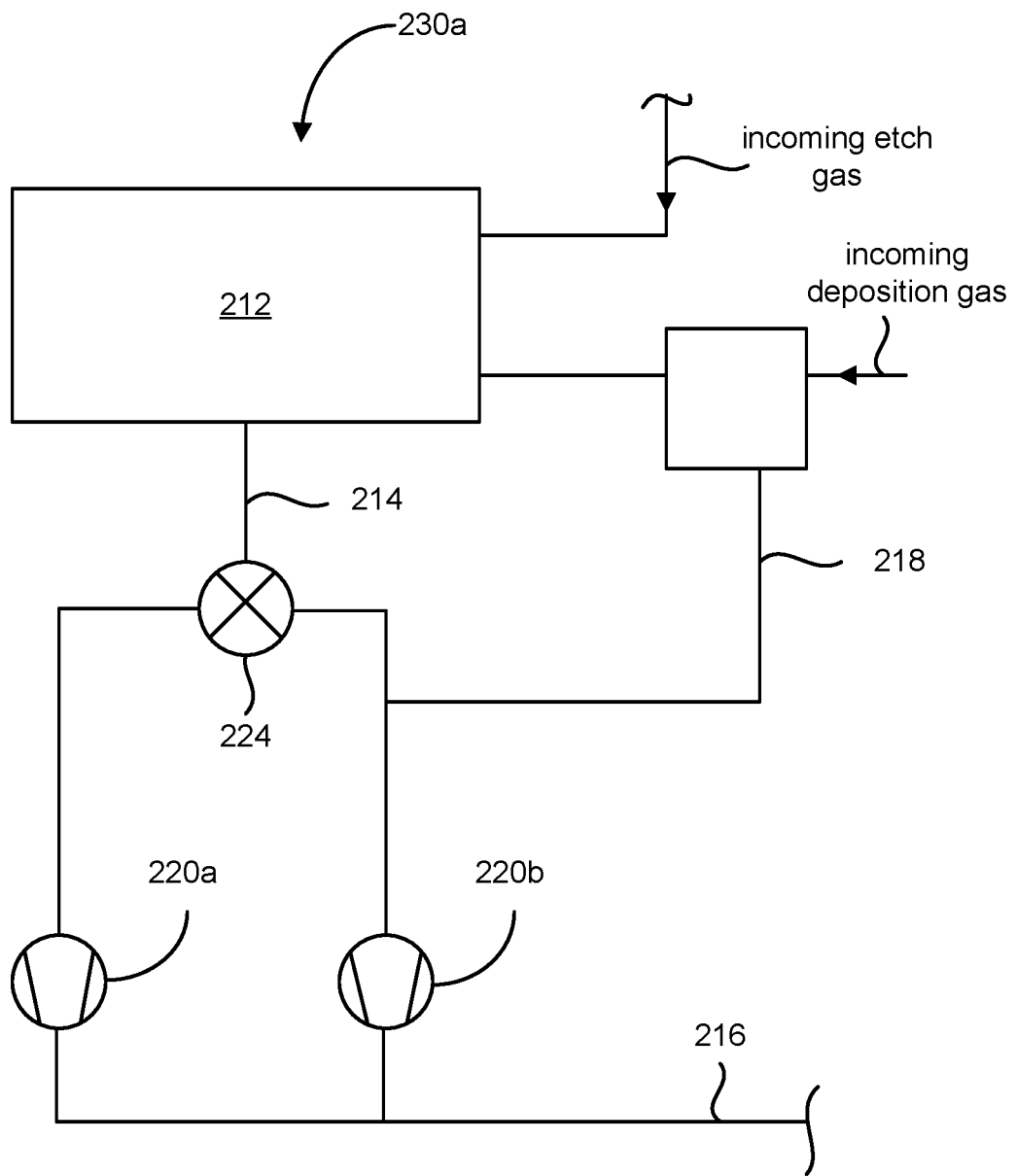
FIG. 2A is a schematic diagram of an example processing apparatus including a "full divert" vacuum pump system having two separate pumps according to some implementations.

FIG. 2A is a schematic diagram of an example processing apparatus including a "full divert" vacuum pump system 230a having two separate pumps according to some implementations. In some embodiments, the two separate pumps are two separate roughing pumps. A processing chamber 212, such as a processing chamber described above in FIGS. 1A and 1B, may exhaust etch gases and deposition precursors through an exhaust port. The etch gases and deposition precursors may be travel through a conduit such as a foreline 214. A valve 224 may be disposed between the foreline 214 and the two separate pumps. The valve 224 serves as a switchable valve that switches to direct etch gases through a first roughing pump 220a when the processing chamber 212 is performing etch operations. The valve 224 switches to direct deposition precursors through a second roughing pump 220b when the processing chamber 212 is performing deposition operations. Separating the flow of etch gases and deposition precursors between separate roughing pumps avoids deposition product buildup that occur as a result of mixing etch and deposition gases. In some embodiments, the etch gases include hydrogen bromide and the deposition precursors include an amino-silane precursor. In some embodiments, the valve 224 may switch to direct etch gases through the first roughing pump 220a when the etch gas includes hydrogen bromide. The first roughing pump 220a and the second roughing pump 220b are positioned downstream from the foreline 214. A removal line 216 may be connected to and positioned downstream from the first roughing pump 220a and the second roughing pump 220b to remove the etch gases and deposition precursors from the vacuum pump system 230a. A purge operation may occur between etch and deposition operations, where a purge time may be sufficient to completely remove etch gases and deposition precursors from the foreline 214. Techniques for determining a sufficient purge time are described below.

Incoming etch gas and incoming deposition gas may enter the processing chamber 212 through different gas lines. Etch gas may be provided from an etch gas delivery source and deposition gas may be provided from a deposition precursor delivery source. In some implementations, some deposition gas from the deposition precursor delivery source may be diverted by a divert line 218 and directly exhausted to the second roughing pump 220b. The diverted deposition gas does not enter the processing chamber 212. The divert line 218 may be fluidly coupled to the deposition precursor delivery system and configured to direct unused deposition precursors in a deposition cycle to the second roughing pump 220b. The deposition cycle may be an ALD cycle. Typically, ALD is a deposition technique using surface-self-limited deposition reactions to deposit films on a layer-by-layer basis. Each ALD cycle includes a sequence of dosing and conversion phases. In some embodiments, the ALD cycle includes a sequence of dosing, purging, conversion, and purging phases. The dosing phase involves delivery and adsorption of precursor material onto a substrate surface in the processing chamber, and the conversion phase involves conversion of the adsorbed precursor material to an adsorption-limited amount of deposited material (e.g., passivation material). The conversion phase generally involves delivery of reactant species such as an oxidizing species (e.g., $O_2$) to convert the adsorbed precursor material. During the conversion phase of an ALD cycle, deposition gas may continue to flow from the deposition precursor delivery source. However, some deposition gas flowing from the deposition precursor delivery source may be diverted during conversion phases of an ALD cycle. Such diverted deposition gas will not mix with etch gases in the processing chamber or in any of the roughing pumps.

Figure 2B:
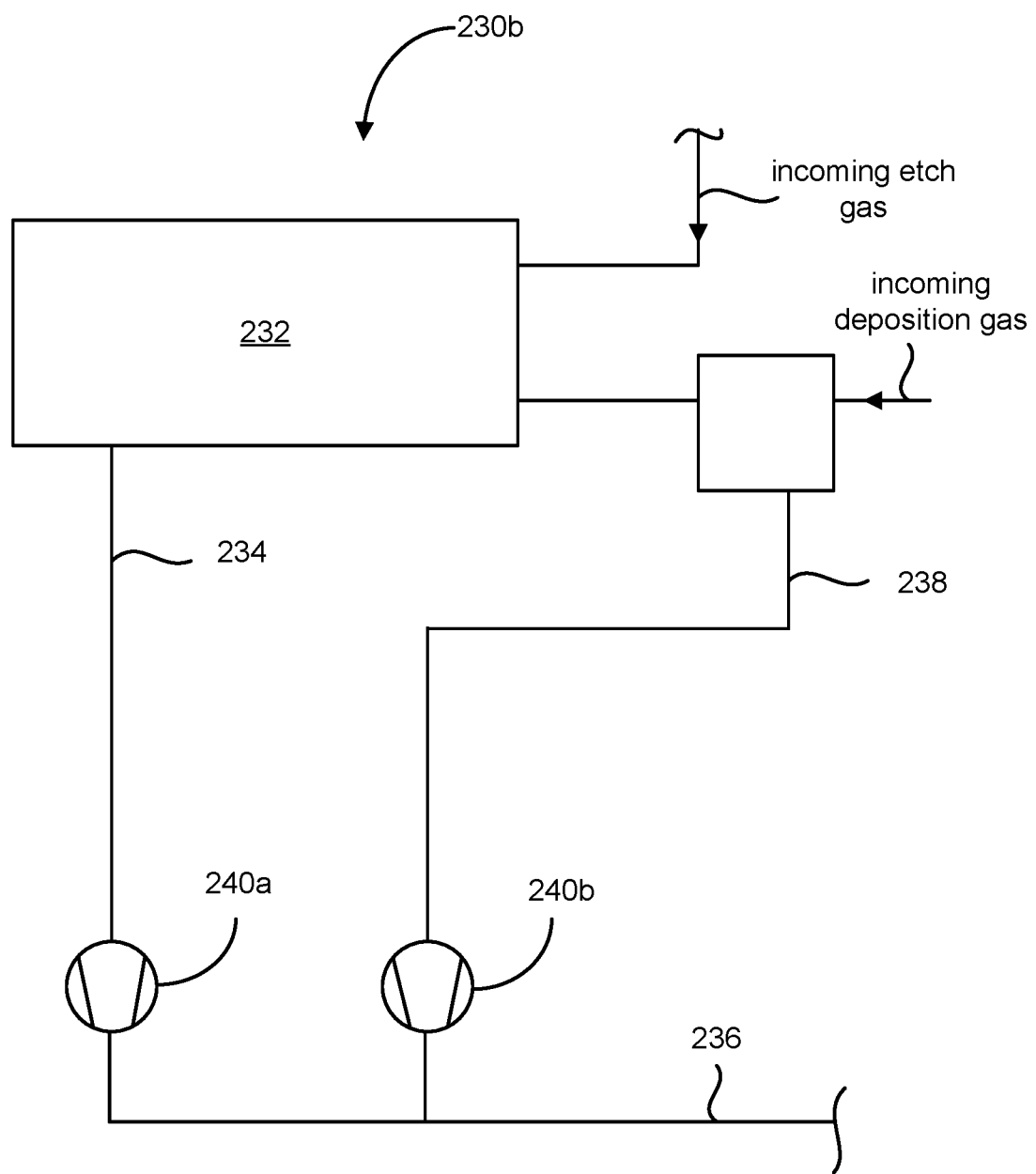
FIG. 2B is a schematic diagram of an example processing apparatus including a "bypass divert" vacuum pump system having two separate pumps according to some implementations.

FIG. 2B is a schematic diagram of an example processing apparatus including a "bypass divert" vacuum pump system 230b having two separate pumps according to some implementations. A processing chamber 232, such as a processing chamber described above in FIGS. 1A and 1B, may exhaust etch gases and deposition precursors through an exhaust port. The etch gases and deposition precursors may be travel through a conduit such as a foreline 234. Rather than incorporating a valve to switch between etch gases and deposition precursors, the etch gases and deposition precursors flow through a first roughing pump 240a. However, some deposition gas may be diverted by a divert line 238 to a second roughing pump 240b. This deposition gas does not participate in deposition operations occurring in the processing chamber 232. Specifically, deposition gas during a conversion phase of an ALD cycle are diverted by the divert line to the second roughing pump 240b. In other words, unused deposition precursors in an ALD cycle flow from the deposition precursor delivery system and travel directly through the second roughing pump 240b without entering the processing chamber 232. Thus, deposition precursors during a dosing phase of the ALD cycle go through the first roughing pump 240a and mix with etch gases whereas deposition precursors during the conversion phase of the ALD cycle go through the second roughing pump 240b and do not mix with etch gases. Though some deposition gases may mix with etch gases in the first roughing pump 240a, the amount of mixing is significantly reduced so that accumulation of deposition byproduct is significantly less. Moreover, the second roughing pump 240b is not in fluid communication with the processing chamber 232, and so the second roughing pump 240b may be shared among multiple modules/apparatuses. Multiple divert lines from other modules/apparatuses (not shown) may divert unused deposition precursors in an ALD cycle through the second roughing pump 240b.

Figure 2C:
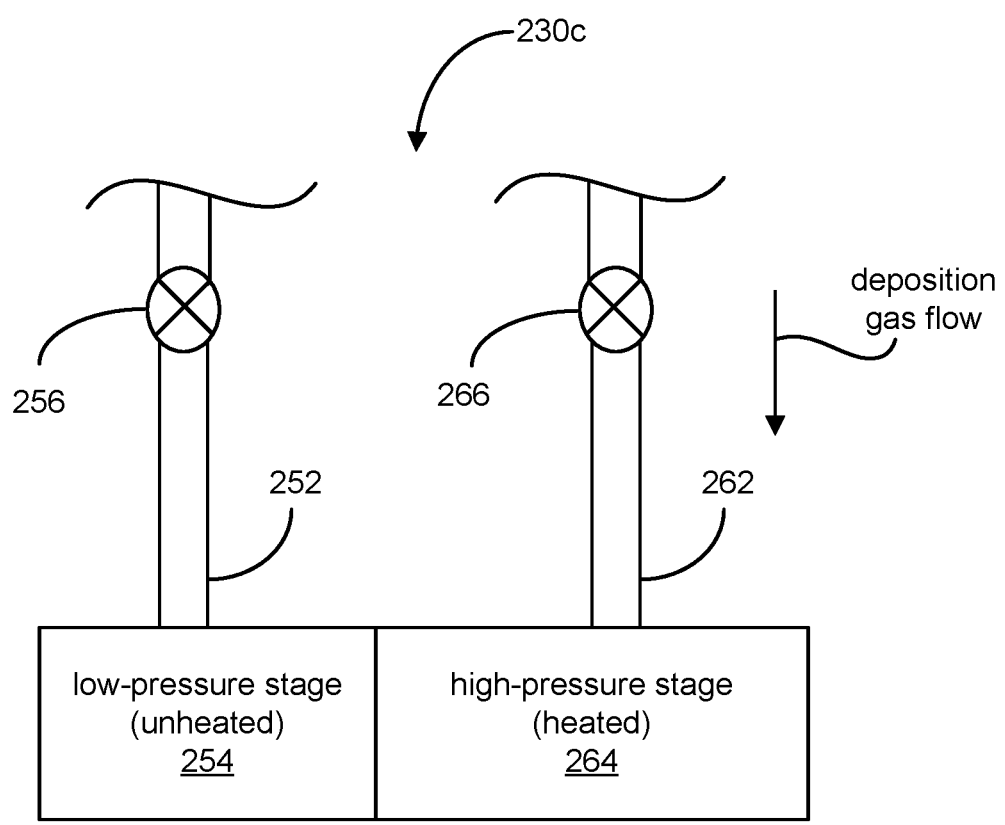
FIG. 2C is a schematic diagram of an example processing apparatus including a "multi-inlet" vacuum pump system operating at different pressure stages according to some implementations.

FIG. 2C is a schematic diagram of an example processing apparatus including a "multi-inlet" vacuum pump system 230c operating at different stages according to some implementations. Instead of having separate pumps for receiving etch and deposition gases, a vacuum pump system 230c can have a pump with multiple inlets. Process gases exhausted from the processing chamber may include etch and deposition gases. One of the multiple inlets may open up to receive process gases from the processing chamber depending on the pump's operating pressure. For example, a first inlet 252 may open up to receive process gases in a low-pressure stage 254, and a second inlet 262 may open up to receive process gases in a high-pressure stage 264. In FIG. 2C, a pump may include a roughing pump (not shown). The roughing pump may or may not include a booster pump (or blower). When the roughing pump operates in a low-pressure range, a first exhaust port 256 coupled to the first inlet 252 may open up to exhaust process gases from the processing chamber (not shown). When the roughing pump operates in a high-pressure range, a second exhaust port 266 coupled to a second inlet 262 may open up to exhaust process gases from the processing chamber. In some implementations, the high-pressure range is between about 1 Torr and about 10 Torr or between about 0.5 Torr and about 5 Torr, and the low-pressure range is between about 0.5 Torr and about 3 Torr or between about 0.1 Torr and about 1 Torr. In some embodiments, deposition gases are generally exhausted from the processing chamber during high-pressure ranges, and etch gases are generally exhausted from the processing chamber during low-pressure ranges. Specifically, ALD processes tend to operate in high-pressure ranges.

Deposition byproduct buildup in the roughing pump may be impacted by pressure and/or temperature. Components operating in the low-pressure stage 254 may be unheated and components operating in the high-pressure stage 264 may be heated. To prevent deposition byproduct buildup in the high-pressure stage 264, the components of the pump may be heated to an elevated temperature that is sufficient to prevent byproduct buildup. In some embodiments, the higher the pressure the higher the temperature needs to be in order to prevent byproduct buildup. In some embodiments, the elevated temperature is equal to or greater than about 160° C., between about 80° C. and about 500° C., between about 100° C. and about 400° C., between about 120° C. and about 300° C., or between about 150° C. and about 250° C. Without being limited by any theory, mixing between deposition precursors and etch gases may more likely occur during high-pressure stages of the pump, and mixing between deposition precursors and etch gases may less likely occur during low-pressure stages of the pump. Therefore, heating components of the pump to the elevated temperature during high-pressure stages may prevent or minimize deposition byproduct buildup. Aspects of heating pump components in a pump are described in further detail below.

In some embodiments, pump components operating in the low-pressure stage 254 may be vulnerable to deposition byproduct buildup. This is in addition to pump components operating in the high-pressure stage 264. In some embodiments, blower components may be separated from rotor components of the vacuum pump system 230c. The blower components may be part of a booster pump of a roughing pump. In some embodiments, the blower components may operate during the low-pressure stage 254 of the roughing pump and the rotor components may operate during the high-pressure stage 264 of the roughing pump. In some embodiments, the blower components and the rotor components may be heated to an elevated temperature sufficient to prevent deposition byproduct buildup. Such components may be illustrated in FIG. 3.

Surface Coatings

A vacuum pump system, including a roughing pump and its components, may be coated with one or more materials for limiting surface reactions that would otherwise cause deposition byproduct buildup in the vacuum pump system. Various pump components of a pump may include but are not limited to rotor components, stator components, inlets, bearings, shafts, and transmission gears. Additional pump components may further include booster pumps and blowers, which may be provided as separate units or integrated with the pump. The rotor components may include, for example, rotary vanes that are located on contra-rotating shafts. The transmission gears transmit torque to the shafts and cause the rotary vanes to rotate in opposite directions and act in an intermeshing manner. The stator components may include, for example, a housing for enclosing the rotor components. One or more inlets may receive etch gases and deposition precursors exhausted from a processing chamber, where the one or more inlets may be coupled to the stator components. The one or more inlets may be connected to a passage leading to the rotor components. The bearings may support various parts of the pump such as the shafts.

In some embodiments, the pump components of the pump in the vacuum pump system are made of a metallic material such as iron. For example, the pump components may be made from cast iron. However, pumps components made from cast iron or other metallic materials may be vulnerable to corrosion and/or deposition byproduct buildup. In some implementations, surfaces of the pump components may be coated with one or more materials that are resistant to corrosion and/or deposition byproduct buildup. Accordingly, a surface coating on the surfaces of the pump components may eliminate or at least reduce surface reactions that would otherwise cause deposition byproduct buildup.

Example materials of surface coatings may include but are not limited to plated nickel, plated cobalt, titanium nitride (TiN), Inconel, Hastelloy, ceramic material, fluoropolymer, and combinations thereof. Such materials may be corrosion-resistant materials. Surfaces of at least an inlet and rotor components of a pump may be coated with the surface coating, thereby protecting the rotor components and inlet of the pump against degradation from deposition byproduct buildup. Other surfaces of pump components, including bearings, shafts, etc., may also be coated with the surface coating.

In some embodiments, the pump components of the pump in the vacuum pump system are made of a ceramic material such as aluminum oxide ($Al_2O_3$). Rather than coating a metallic material, the pump components may be made from a material that is resistant to corrosion and/or deposition byproduct buildup. Therefore, these pump components may eliminate or at least reduce surface reactions that would otherwise cause deposition byproduct buildup.

In some embodiments, the pump components may be heated to further eliminate or reduce surface reactions that cause deposition byproduct buildup. Some pump components may be heated to an elevated temperature, such as a temperature of at least about 160° C., to prevent or otherwise reduce deposition byproduct buildup. For example, one or more shafts may be connected to and support one or more rotor components, where each of the shafts may be connected to a heat source for heating the surfaces of the one or more rotor components. Examples of heat sources may include but are not limited to electrical wires, heat lamps, and hot fluids.

It will be appreciated that embodiments using the aforementioned materials to limit surface reactions may be combined with one or more of the previously mentioned embodiments for preventing deposition byproduct buildup. It will also be appreciated that embodiments using the aforementioned materials to limit surface reactions may be combined with one or more of the embodiments for preventing deposition byproduct buildup discussed below.

Pump Heating

Challenges exist in dimensionally heating all the surfaces of various pump components to a sufficiently hot temperature to prevent deposition byproduct buildup. Improvements in thermal design of a pump, such as a roughing pump, can keep the surfaces of the pump components hot enough to prevent deposition byproduct buildup. Aspects of the present disclosure provide a method of exhausting etch gases and deposition precursors using a vacuum pump system and heating surfaces of pump components of the vacuum pump system to an elevated temperature. The elevated temperature is sufficiently hot to prevent deposition byproduct buildup as a result of reactions between the etch gases and the deposition precursors. For example, the elevated temperature may be equal to or greater than about 160° C., between about 80° C. and about 500° C., between about 100° C. and about 400° C., between about 120° C. and about 300° C., or between about 150° C. and about 250° C. The elevated temperature may be maintained while exhausting the etch gases and deposition precursors. The etch gases may include hydrogen bromide and the deposition precursors may include an amino-silane precursor.

In some embodiments, surfaces of pump components of a pump can be accomplished by circulating hot fluid or heated purge gas through the pump. A reservoir of hot fluid or heated purge gas may be provided outside the vacuum pump system, and the vacuum pump system may draw from the reservoir to heat its pump components. In some embodiments, heating the surfaces of the pump components include heating one or more shafts connected to and supporting one or more rotor components in the pump. In some embodiments, each shaft may include a channel for receiving a heat source, where the heat source includes an electrical wire, a heat lamp, a hot fluid, or combinations thereof. The channel allows thermal energy to be conducted through the shaft and to transfer to surrounding surfaces by radiation and/or conduction. As a result, surfaces of the one or more rotor components may be heated. The surfaces of the one or more rotor components are heated to a temperature of at least 160° C., between about 80° C. and about 500° C., between about 100° C. and about 400° C., between about 120° C. and about 300° C., or between about 150° C. and about 250° C.

Figure 3:
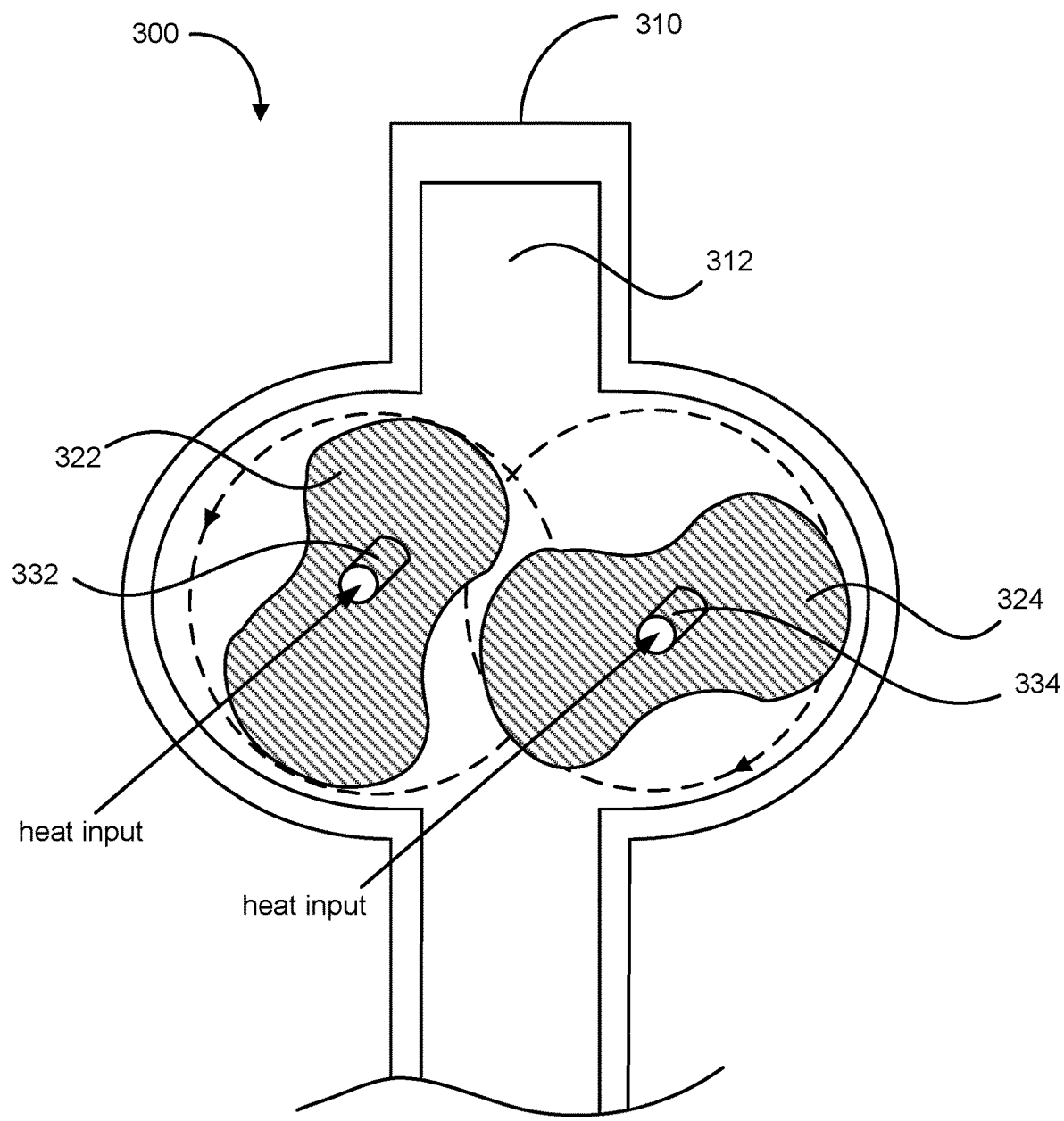
FIG. 3 illustrates an example of rotor components in a vacuum pump system according to some implementations.

FIG. 3 illustrates an example of rotor components in a vacuum pump system 300 according to some implementations. Deposition precursors and etch gases are exhausted from a processing chamber and into a vacuum pump system 300 having a stator component 310 enclosing a first rotor component 322 and a second rotor component 324. The deposition precursors and etch gases pass through a passage 312 in the stator component 310. The first rotor component 322 and the second rotor component 324 may rotate in opposite directions to push gases through the vacuum pump system 300. A first shaft 332 may be connected to and supporting the first rotor component 322, and a second shaft 334 may be connected to and supporting the second rotor component 324. In some embodiments, each shaft 332, 334 may be hollow or provide a channel or opening through which an electrical wire, heat lamp, hot fluid, or other heat source may pass through. In some embodiments, each shaft 332, 334 may include an outer insulating material and an inner conductive material. The shafts 332, 334 may be configured to rotate in contra-rotating directions.

It will be appreciated that embodiments using pump heating may be combined with one or more of the aforementioned embodiments for preventing deposition byproduct buildup, including embodiments involving separate pumps, separate inlets, and surface coatings. It will also be appreciated that embodiments using pump heating may be combined with one or more of the embodiments for preventing deposition byproduct buildup discussed below.

Pump Purging

Purge operations may be performed between deposition and etch operations to more thoroughly purge deposition precursors, etch gases, and/or deposition byproducts from the vacuum pump system. The duration of the purge operations may be determined to be sufficiently long enough so that deposition precursors, etch gases, and deposition byproducts are not detected in the vacuum pump system. That way, deposition precursors and etch gases are not afforded an opportunity to mix together and cause deposition byproduct buildup. Such determinations may be made using one or more sensors in the vacuum pump system. For example, purge times can be measured for purging deposition precursors, etch gases, and deposition byproducts from the vacuum pump system using residual gas analysis (RGA), Fourier Transform Infrared (FTIR) gas analysis, or other suitable gas analysis. In some embodiments, the etch gases include hydrogen bromide and the deposition precursors include an amino-silane precursor.

A method of purging a pump, such as a roughing pump, can include performing purge operations between etch and deposition operations in a processing chamber. A method can include performing an etch operation on a wafer in a processing chamber, where the one or more etch gases are exhausted through a pump in fluid communication with the processing chamber, and purging the one or more etch gases from the pump according to a first predetermined duration. The method can further include performing a deposition operation on the wafer in the processing chamber, where one or more deposition precursors are exhausted through the pump, and purging the one or more deposition precursors from the pump according to a second predetermined duration. In some embodiments, the first predetermined duration and the second predetermined duration may be determined by RGA, FTIR gas analysis, or other suitable gas analysis. For example, RGA, FTIR gas analysis, or other suitable gas analysis may use sensors to measure when etch gases and/or deposition precursors are no longer present in a gas line of the vacuum pump system, thereby serving as an endpoint detection system. Thus, the gas analysis can determine suitable purge times for removing etch gases or removing deposition precursors from the vacuum pump system.

A method of determining purge times for purging a pump can include performing purge operations between etch and deposition operations in a processing chamber and measuring purge times during the purge operations. The method can include performing an etch operation on a wafer in a processing chamber, where one or more etch gases are exhausted through a pump in fluid communication with the processing chamber, purging the one or more etch gases from the pump, and measuring a first purge time for purging the one or more etch gases. The method can further include performing a deposition operation on the wafer in the processing chamber, where one or more deposition precursors are exhausted through the pump, purging the one or more deposition precursors from the pump, and measuring a second purge time for purging the one or more deposition precursors. The purge times may be measured by RGA, FTIR gas analysis, or other suitable gas analysis. Future purge operations performed in the processing chamber may utilize the purge times measured by gas analysis so that the purge times are long enough for purging deposition precursors and etch gases completely or at least substantially from the vacuum pump system.

The longer purge times and more accurately measured purge times may prevent unwanted mixing of deposition precursors and etch gases in the vacuum pump system. Embodiments using longer purge times and more accurately measured purge times may be combined with one or more aforementioned embodiments for preventing deposition byproduct buildup, including embodiments involving separate pumps, separate inlets, surface coatings, and pump heating. For example, RGA or FTIR gas analysis can be used to determine when to switch a valve to divert etch gases through a first roughing pump and when to switch a valve to divert deposition precursors through a second roughing pump. It will be appreciated that embodiments using longer purge times and more accurately measured purge times may be combined with one or more embodiments for preventing deposition byproduct buildup discussed below.

Pump Cleaning

Clean operations may be performed between deposition and etch operations, after completion of deposition or etch operations, or after processing a certain number of wafers in a processing chamber. The clean operations may be performed to clean a vacuum pump system to prevent mixing of deposition precursors and etch gases, or to remove deposition byproducts from the vacuum pump system. In some embodiments, the deposition precursors may include an amino-silane precursor and the etch gases may include hydrogen bromide. Performing the clean operations include flowing reactive gases through the vacuum pump system, where the vacuum pump system includes one or more pumps in fluid communication with the processing chamber. The one or more pumps may include a roughing pump. In some embodiments, the one or more pumps may further include a booster pump and/or turbomolecular pump. In some embodiments, the reactive gases are flowed through the processing chamber and through the one or more pumps of the vacuum pump system. In some embodiments, the reactive gases include radicals and/or ions generated in-situ in the processing chamber, generated in a remote plasma source, or generated by a plasma source installed in a foreline connected to the one or more pumps of the vacuum pump system.

Clean operations generally involve clean chemistries that are effective in removing deposition precursors, etch gases, and deposition byproducts. In some embodiments, a clean operation may be part of a waferless automated clean (WAC) operation, though it will be understood that the clean operation may be performed with or without a wafer in the processing chamber. Clean chemistries may include reactive gases such as a fluorine-containing species, a chlorine-containing species, a bromine-containing species, an iodine-containing species, an oxygen-containing species, or combinations thereof.

Figure 4:
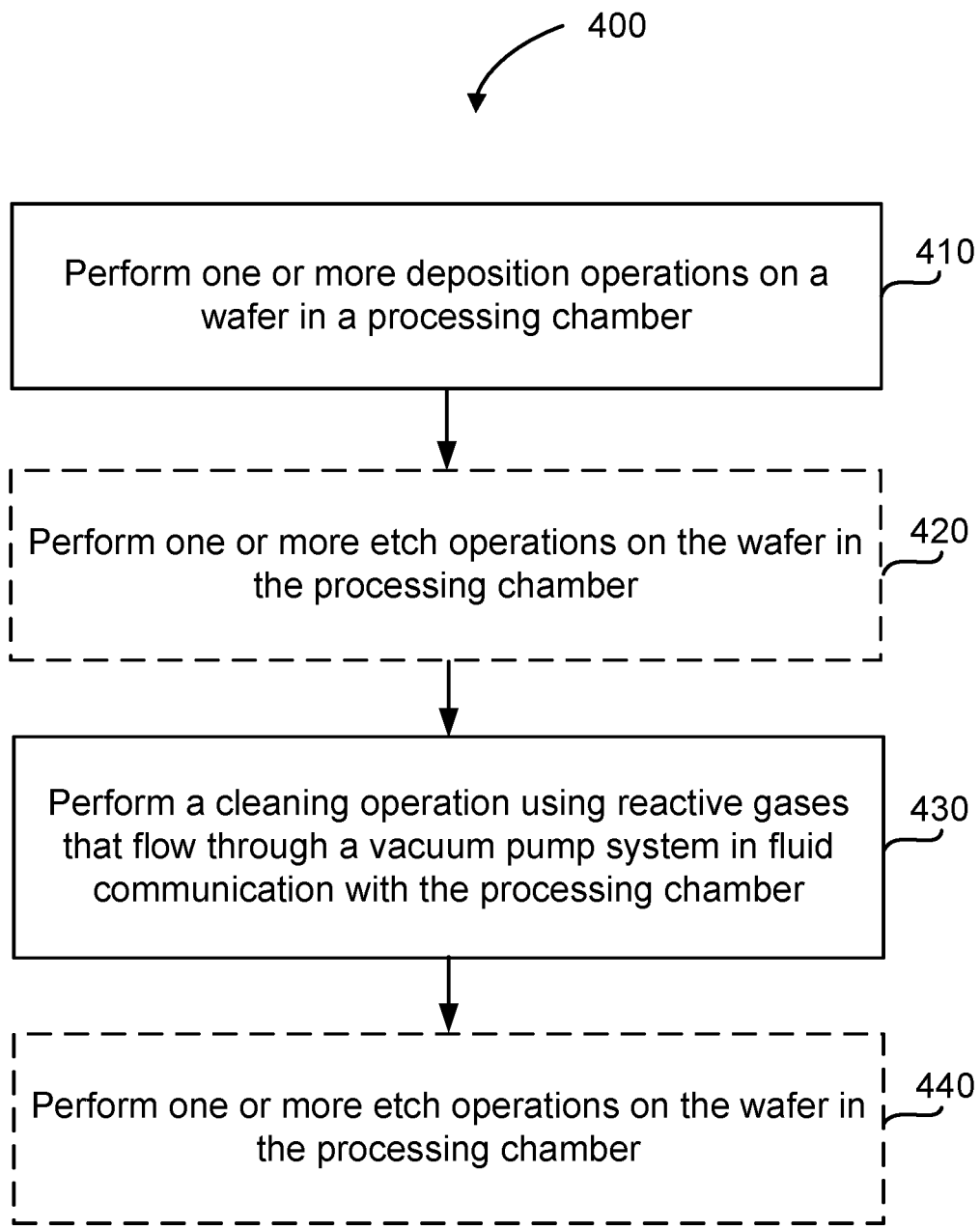
FIG. 4 shows a flow diagram of an example method of a cleaning process for preventing deposition byproduct buildup in a vacuum pump system according to some implementations.

FIG. 4 shows a flow diagram of an example method of a cleaning process for preventing deposition byproduct buildup in a vacuum pump system according to some implementations. A cleaning process 400 as shown in FIG. 4 may be performed with fewer, additional, or different operations.

At block 410 of the cleaning process 400, one or more deposition operations are performed in a processing chamber. The one or more deposition operations may use one or more deposition precursors to deposit material on a wafer. In some embodiments, the one or more deposition operations may use one or more deposition precursors of an ALD cycle. The one or more deposition precursors may include an amino-silane precursor. The one or more deposition precursors may be exhausted to one or more pumps of a vacuum pump system, where the one or more pumps are in fluid communication with the processing chamber. The one or more pumps may include a roughing pump.

At block 420 of the cleaning process 400, one or more etch operations are performed in the processing chamber. The one or more etch operations may use one or more etch gases to etch material from the wafer. The one or more etch gases may include hydrogen bromide. The one or more etch gases may be exhausted to the one or more pumps of the vacuum pump system. As shown in FIG. 4, in some embodiments, the one or more etch operations may be performed before a cleaning operation at block 430. Alternatively, the one or more etch operations may be performed after the cleaning operation at block 430. This is shown at block 440 of FIG. 4. In other words, the cleaning operation may be performed between deposition and etch operations when processing a wafer, or may be performed after deposition and etch operations are completed when processing a wafer.

At block 430, a cleaning operation is performed using reactive gases that flow through the vacuum pump system, where the vacuum pump system is in fluid communication with the processing chamber. In some embodiments, the one or more deposition operations at block 410, the one or more etch operations at block 420 or block 440, and the cleaning operation at block 430 may be performed with the wafer in the processing chamber. In some embodiments, the cleaning operation at block 430 may be performed without the wafer in the processing chamber.

In some embodiments, the reactive gases may include fluorine-containing species such as nitrogen trifluoride ($NF_3$), carbon tetrafluoride ($CF_4$), xenon difluoride ($XeF_2$), sulfur hexafluoride ($SF_6$), and chlorine trifluoride ($ClF_3$). In some embodiments, the reactive gases may include oxygen-containing species such as oxygen ($O_2$) and ozone ($O_3$). In some embodiments, the reactive gases may include chlorine-containing species such as chlorine ($Cl_2$). The reactive gases may remove deposition precursors or etch precursors from the vacuum pump system, or may remove deposition byproducts that have formed in the vacuum pump system.

In some embodiments, the reactive gases may include radicals and/or ions of fluorine, chlorine, oxygen, or combinations thereof. Radicals and/or ions of fluorine may include $F*$ and $F_2^+$, radicals and/or ions of chlorine may include $Cl*$, and $Cl^-$, and $Cl^+$, radicals and/or ions of oxygen may include $O*$ and $O_2^-$. Generally, radicals of fluorine, chlorine, and oxygen have a higher likelihood of traveling further without recombining through the one or more pumps of the vacuum pump system than ions of fluorine, chlorine, and oxygen. The reactive gases may remove deposition precursors or etch precursors from the vacuum pump system, or may remove deposition byproducts that have formed in the vacuum pump system.

In some implementations of the cleaning process 400, the cleaning process 400 further includes generating the reactive gases, where the reactive gases include plasma-activated species of fluorine, chlorine, oxygen, or combinations thereof. Plasma-activated species may include radicals and/or ions of fluorine, chlorine, oxygen, or combinations thereof as described above. Various plasma sources may be used in generating the plasma-activated species for performing the cleaning operation at block 430. In some embodiments, the plasma-activated species may be generated in-situ in the processing chamber by a plasma reaction. For example, a fluorine-containing gas, a chlorine-containing gas, an oxygen-containing gas, or combinations/sequences thereof may be introduced into the processing chamber and a plasma may be ignited to form plasma-activated species of the fluorine-containing gas, the chlorine-containing gas, the oxygen-containing gas, or combinations/sequences thereof. The plasma-activated species may flow from the processing chamber and through the one or more pumps of the vacuum pump system to prevent deposition byproduct buildup. In some embodiments, the plasma-activated species may be generated in a plasma source located in a foreline, where the foreline provides interconnection between the one or more pumps and the processing chamber. That way, the plasma-activated species may be generated adjacent to the one or more pumps to limit the likelihood of recombining before reaching the one or more pumps. For example, a Litmas™ plasma source may be installed in the foreline adjacent to the one or more pumps for generating the plasma-activated species of a gas containing fluorine, chlorine, oxygen, or combinations/sequences thereof. In some embodiments, the plasma-activated species may be generated in a remote plasma source located outside the foreline. The remote plasma source may be positioned upstream of the foreline. The plasma-activated species may be generated in the remote plasma source and injected to the foreline to pass through the one or more pumps.

In some implementations of the cleaning process 400, ozone ($O_3$) may be flowed to one or more pumps of the vacuum pump system during the cleaning operation at block 430. Ozone generally has a longer lifetime than ions and/or radicals of oxygen. Therefore, ozone is more likely to reach the one or more pumps of the vacuum pump system without recombining. In some implementations, ozone may be provided in the processing chamber and exhausted to the vacuum pump system. In some implementations, ozone may be generated by a separate unit that introduces the ozone into the foreline leading to the one or more pumps. For example, such a separate unit for generating ozone may be installed in the foreline or in a region between the processing chamber and the foreline. The ozone provided by the separate unit or provided in the processing chamber may have a better chance of reaching the one or more pumps than plasma-activated species of oxygen provided by a remote plasma source or provided in-situ in the processing chamber.

Ozone flowed to the one or more pumps of the vacuum pump system may react with species in pump equipment to form oxidized products. For example, the ozone may deliver oxidizing radicals that form bromine oxide (BrO), silicon dioxide ($SiO_2$), chlorine oxide (ClO), or combinations thereof. After ozone is flowed to the one or more pumps of the vacuum pump system, fluorine-containing species may be flowed to the one or more pumps. The fluorine-containing species may include radicals and/or ions of fluorine, where the fluorine-containing species may originate from the processing chamber or from a remote plasma source. The oxidized products may be etched away by the fluorine-containing species. Without being limited by any theory, the fluorine-containing species may cause the oxidized products to become volatile. The volatilized products may be exhausted to abatement.

In some implementations, the cleaning operation at block 430 includes flowing ozone followed by flowing fluorine-containing species through the vacuum pump system to remove or prevent deposition byproduct buildup. Ozone treatment as a cleaning operation may be performed simultaneously during wafer processing or at intervals after wafer processing. In one example, such ozone treatment may be performed simultaneously with performing one or more deposition operations at block 410 or one or more etch operations at block 420. For example, ozone can be flowed simultaneous with the flow of etch gases in the processing chamber. In another example, such ozone treatment may be performed in between the one or more deposition operations at block 410 and the one or more etch operations at block 420. This may cause deposition precursors to oxidize immediately. In yet another example, such ozone treatment may be performed at intervals after the one or more deposition operations at block 410 and the one or more etch operations at block 420.

The clean chemistries used in cleaning operations may prevent deposition byproduct buildup in the vacuum pump system. Embodiments using such clean chemistries may be combined with one or more aforementioned embodiments for preventing deposition byproduct buildup, including embodiments involving separate pumps, separate inlets, surface coatings, pump heating, and longer and more accurately measured purge times. For example, reactive gases may be flowed through the one or more pumps in a cleaning operation simultaneous with heating surfaces of pump components to an elevated temperature, where the elevated temperature is equal to or greater than about 160° C., between about 80° C. and about 500° C., between about 100° C. and about 400° C., between about 120° C. and about 300° C., or between about 150° C. and about 250° C.

Gas Ejector

Deposition precursors and etch gases may be exhausted from a processing chamber by a roughing pump of a vacuum pump system. Mixing of deposition precursors and etch gases may result in unwanted deposition in the roughing pump, which may lead to damage to pump equipment. Specifically, the deposition precursors and etch gases may react with components in the vacuum pump system to form byproducts that can cause the vacuum pump system to fail. Even though purge gas (e.g., $N_2$) may be used to vent the roughing pump, unwanted deposition may still occur in the roughing pump and particularly on moving parts of the roughing pump. For example, unwanted deposition may occur at a later stage of the roughing pump or at an outlet of the roughing pump.

Without being limited by any theory, high pressure spots may exist at the outlet of the roughing pump, where such high pressure spots are generally proximate to the later stages of the roughing pump. Exhausted gases are discharged from the roughing pump and may be discharged to atmospheric pressures or near-atmospheric pressures. As used herein, "near-atmospheric" pressures are pressures within 10% of atmospheric pressure (i.e., 760 Torr). As a result of such high pressure spots at the outlet (e.g., discharge port) of the roughing pump, this can lead to stagnant flow of the exhausted gases at the outlet of the roughing pump. This may cause the deposition precursors and etch gases to be retained at the outlet of the roughing pump for a relatively long duration. The deposition precursors and etch gases may be retained long enough to mix and cause unwanted deposition. Furthermore, without being limited by any particular theory, higher pressure of gases at various stages of the vacuum pump system can increase the rate of reactions significantly. Specifically, higher pressure conditions may accelerate reactions between deposition precursors such as amino-silanes and etch gases such as hydrogen bromide, whereas lower pressure conditions may slow down reactions between deposition precursors and etch gases.

Figure 5:
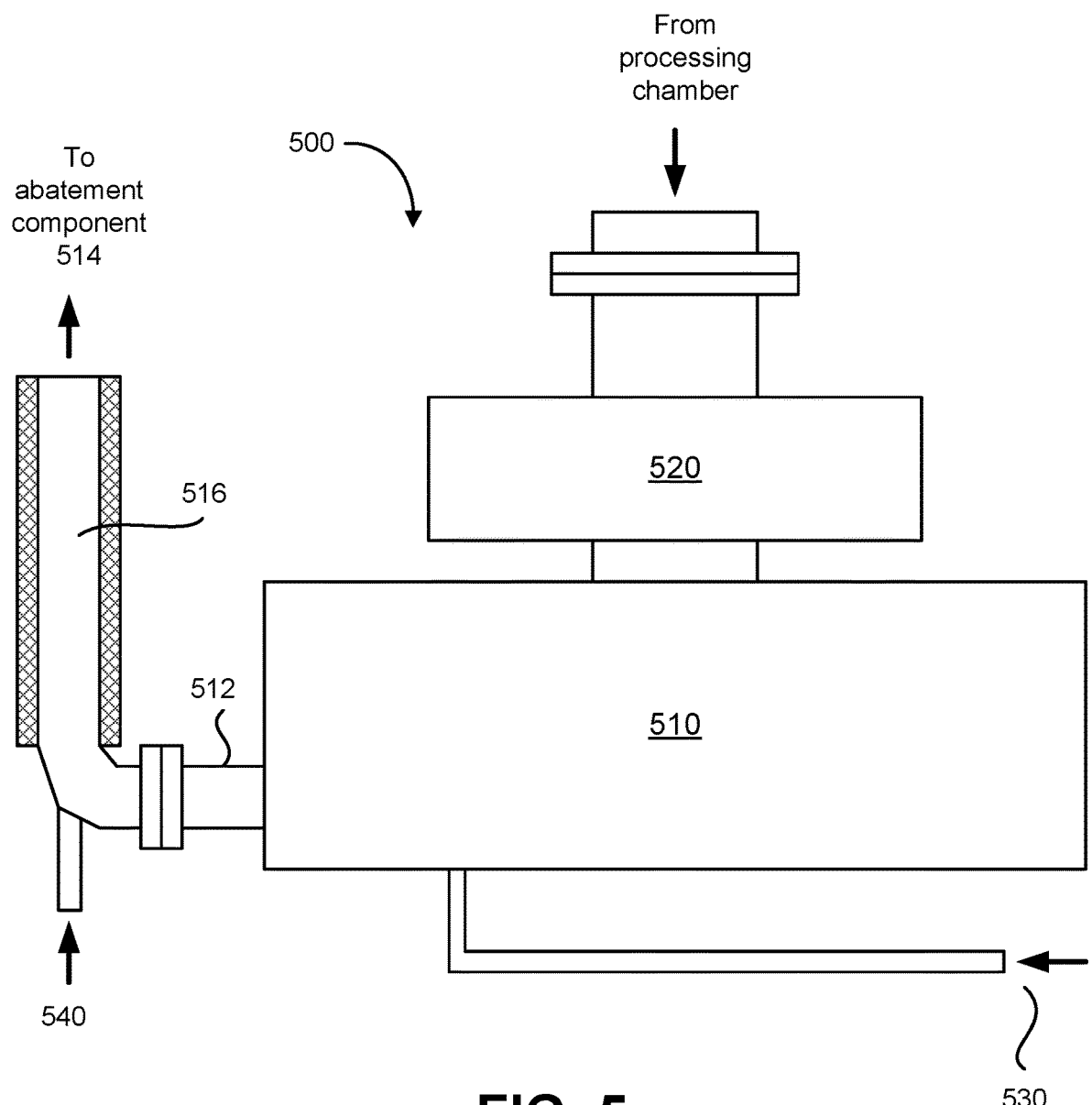
FIG. 5 is a schematic diagram of an example vacuum pump system including a roughing pump with an outlet in fluid communication with an abatement component.

FIG. 5 is a schematic diagram of an example vacuum pump system 500 including a roughing pump 510 with an outlet 512 in fluid communication with an abatement component 514. The vacuum pump system 500 includes a roughing pump 510. In some implementations, the roughing pump 510 may be combined with an optional booster pump 520 or may optionally include a booster pump 520. Deposition precursors and etch gases may be exhausted from a processing chamber (not shown) through the roughing pump 510. The roughing pump 510 may include one or more moving parts, where the one or more moving parts can include rotor components. In some implementations, purge gas 530 such as $N_2$ may be provided to flow through the roughing pump 510 to vent the roughing pump 510 of the deposition precursors and the etch gases. The vented deposition precursors and etch gases may exit the roughing pump 510 at an outlet 512 of the roughing pump 510. The outlet 512 of the roughing pump 510 may be a discharge port. In some implementations, the vented deposition precursors and etch gases may be discharged to an abatement component 514 to treat the vented deposition precursors and etch gases. A line 516 that comprises piping or tubing may connect the outlet 512 of the roughing pump 510 with the abatement component 514. The vented deposition precursors and etch gases may be exhausted at an exhaust pressure of about 760 Torr at the outlet 512 of the roughing pump 510. One or more stages of the roughing pump 510 may be at sub-atmospheric pressures (i.e., less than 760 Torr) or low pressures during operation. The line 516 between the abatement component 514 and the roughing pump 510 may be at atmospheric pressures (i.e., about 760 Torr) during operation. Even if additional diluting gas 540 (e.g., $N_2$) is provided at the outlet 512 of the roughing pump 510, any reduction in pressure may be negligible to efficiently exhaust gases from the outlet 512 of the roughing pump 510 and prevent unwanted deposition. The diluting gas 540 serves to dilute the exhaust gases, and the line 516 between the roughing pump 510 and the abatement component 514 is only under a small amount of vacuum pull that may be a few Torr below atmospheric pressure.

As discussed above, the high pressure conditions at the outlet 512 of the roughing pump 510 may lead to stagnant flow and cause exhausted gases to be retained and may increase a rate of reaction for unwanted byproduct formation. Unwanted byproducts may form on the one or more moving parts of the roughing pump 510, including on any of the one or more moving parts proximate to the outlet 512 of the roughing pump 510. This can cause the one or more moving parts to seize and lead to failure/damage of the vacuum pump system 500.

In the present disclosure, one or more gas ejectors may be provided at the outlet of the roughing pump from which gases are exhausted. The one or more gas ejectors may be configured to reduce a pressure at the outlet of the roughing pump, where the one or more gas ejectors may be connected in series with the roughing pump and positioned downstream from the roughing pump. The one or more gas ejectors proximate the outlet of the roughing pump serve to reduce an exhaust pressure of the roughing pump. The one or more gas ejectors create suction to efficiently discharge exhausted gases from the outlet of the roughing pump, and thereby reduce the exhaust pressure at the roughing pump.

Gas ejectors are pumps that use high-pressure gas(es) to carry along and compress other gas(es). Gas ejectors produce a high-velocity jet stream and entrain a low-pressure stream to produce a mixed stream moving at an intermediate velocity. In other words, gas ejectors use high-pressure gas to compress and vent low-pressure gas without the use of moving parts. As used herein, gas ejectors may also be referred to as aspirators, venturi jets, venturi pumps, venturi jet ejectors, jet pumps, jet mixers, jet ejectors, air ejectors, and eductors.

Figure 6:
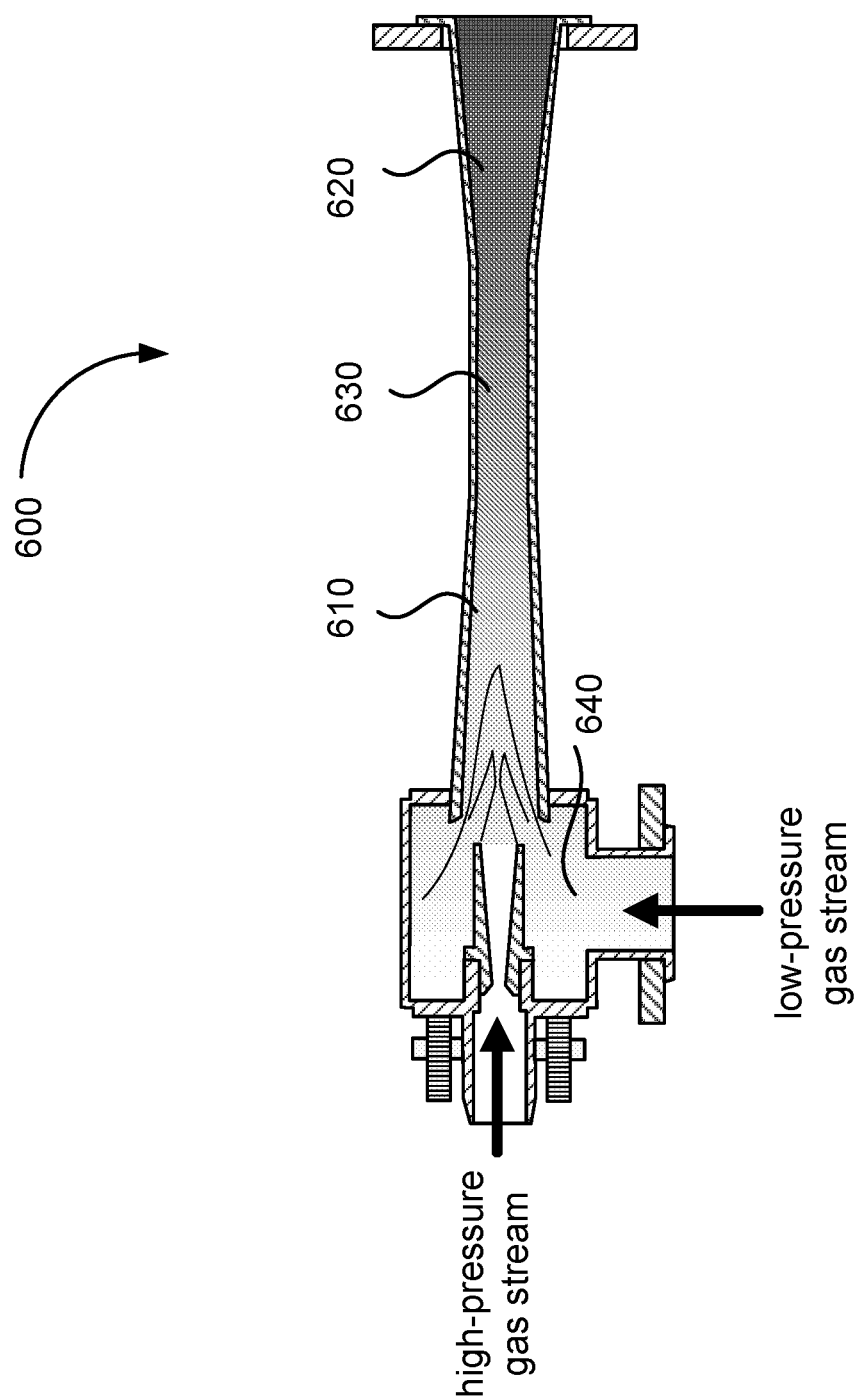
FIG. 6 is a cross-sectional schematic diagram of an example venturi pump showing a pressure gradient across a length of the venturi pump according to some implementations.

The one or more gas ejectors of the present disclosure may be venturi pumps that utilize a "venturi effect" to efficiently exhaust gases from the roughing pump and reduce pressure at the outlet of the roughing pump. The "venturi effect" is the reduction in fluid pressure that results when a fluid flows through a constricted portion of a channel. FIG. 6 is a cross-sectional schematic diagram of an example venturi pump 600 showing a pressure gradient across a length of the venturi pump 600 according to some implementations. An injection gas is introduced as motive flow at a high velocity and at a high inlet pressure. A body of the venturi pump 600 includes a converging motive section 610, a diverging discharge section 620, and a venturi gap 630 between the converging motive section 610 and the diverging discharge section 620. The converging motive section 610 increases fluid velocity of a high-pressure gas stream. An increase in fluid velocity results in a low pressure zone, which provides a suction force to pull in a low-pressure gas stream. The low pressure zone may be provided in a suction port 640 of the venturi pump 600, where the suction port 640 is in fluid communication with the converging motive section 610. The suction port 640 may be connected to a device requiring vacuum or reduced pressure. The low-pressure gas stream mixes with the high-pressure gas stream in the converging motive section 610. The mixed gas stream is carried through the venturi gap 630 positioned downstream from the converging motive section 610. The venturi gap 630 is a constricted part of the body of the venturi pump 600 in which the mixed gas stream is maintained at a low pressure with a high fluid velocity. The mixed gas stream then flows through the diverging discharge section 620 that then reduces the fluid velocity and increases the pressure, thereby compressing the mixed gas stream. This enables the venturi pump 600 to discharge the mixed gas stream at a pressure greater than that of the suction port 640.

Typically, gas ejectors or venturi pumps are used in a number of large-scale industrial applications. In one example, venturi pumps are used to convey and move powders, pellets, and bulk solids in the food industry. In another example, venturi pumps can pull vacuum for pick-and-place operations. In yet another example, venturi pumps serve to exhaust steam in the power plant industry. In still yet another example, venturi pumps are used in determining fuel or combustion pressures in jet or rocket engines.

However, one or more venturi pumps of the present disclosure are used with a vacuum pump system of a semiconductor processing apparatus to reduce pressure at an exhaust of a roughing pump and limit deposition in the roughing pump. The one or more venturi pumps are connected in series with the roughing pump or a primary pump of the vacuum pump system. Examples of vacuum pump systems incorporating one or more venturi pumps are shown in FIGS. 7, 8A, 8B, and 8C. The semiconductor processing apparatus may include a processing chamber for performing deposition and etch operations.

Figure 9:
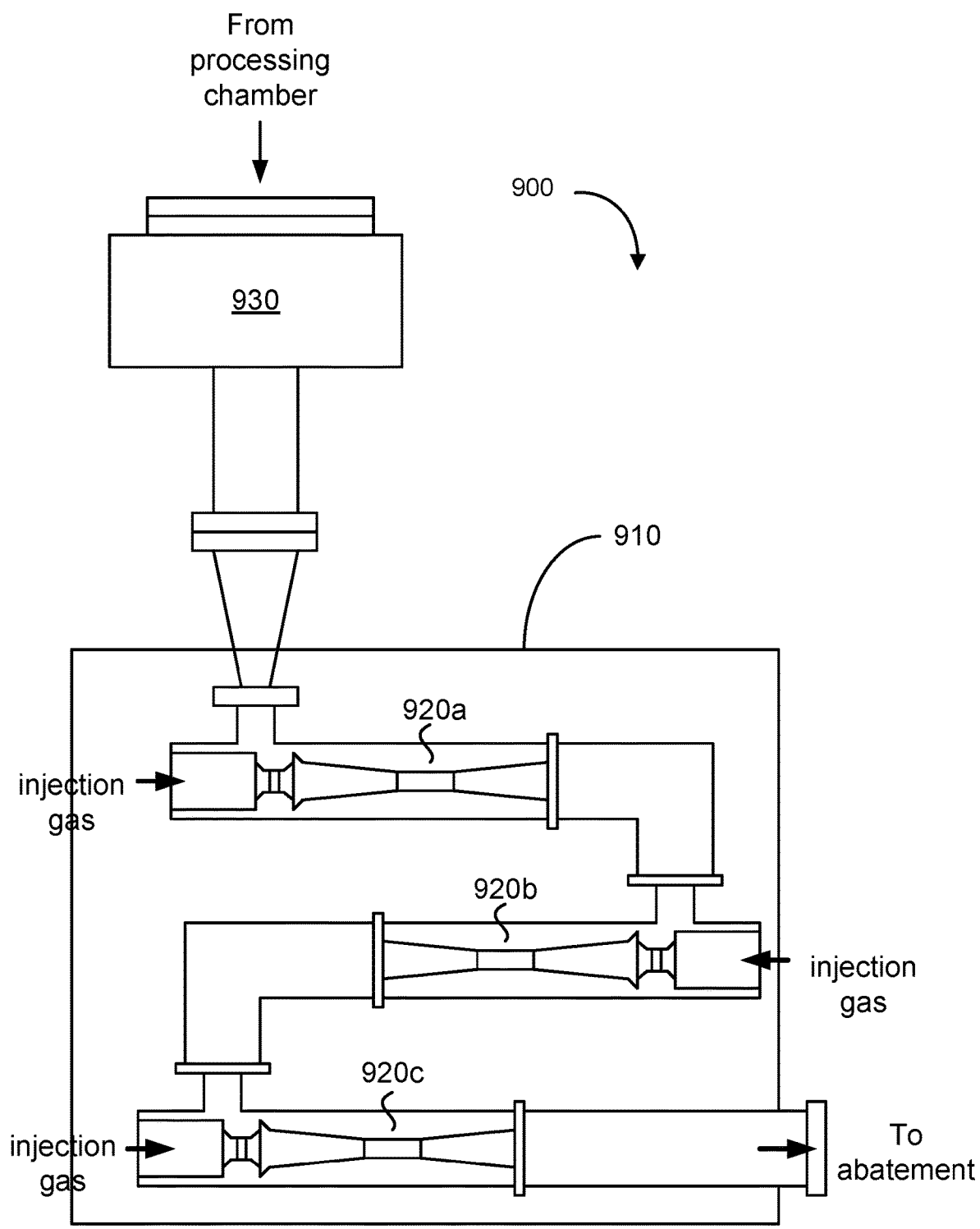
FIG. 9 shows a schematic diagram of an example vacuum pump system including a plurality of venturi pumps operating as a multi-stage venturi backing pump of the vacuum pump system according to some implementations.

In the alternative, a plurality of venturi pumps operate as the primary pump or backing pump of a vacuum pump system. The plurality of venturi pumps may be connected in series and/or in parallel to provide a multi-stage venturi backing pump. The plurality of venturi pumps may be connected to an exhaust of a processing chamber, where the processing chamber is configured to perform deposition and etch operations. The plurality of venturi pumps may serve to exhaust deposition precursors and etch gases from the processing chamber. In some implementations, the plurality of venturi pumps may be configured to bring the processing chamber to a "partial" vacuum or "rough" vacuum, where the processing chamber may be brought to a pressure between about 1 Torr and atmosphere. Instead of using a roughing pump, the plurality of venturi pumps can serve the same or similar function as the roughing pump except without any moving parts. In some implementations, a number of the plurality of venturi pumps may be between about 2 and about 6. Using a plurality of venturi pumps as a primary pump in a vacuum pump system can avoid unwanted byproduct formation from deposition precursors and etch gases. An example of a vacuum pump system using a plurality of venturi pumps as a backing pump or primary pump for a processing chamber is shown in FIG. 9.

Figure 7:
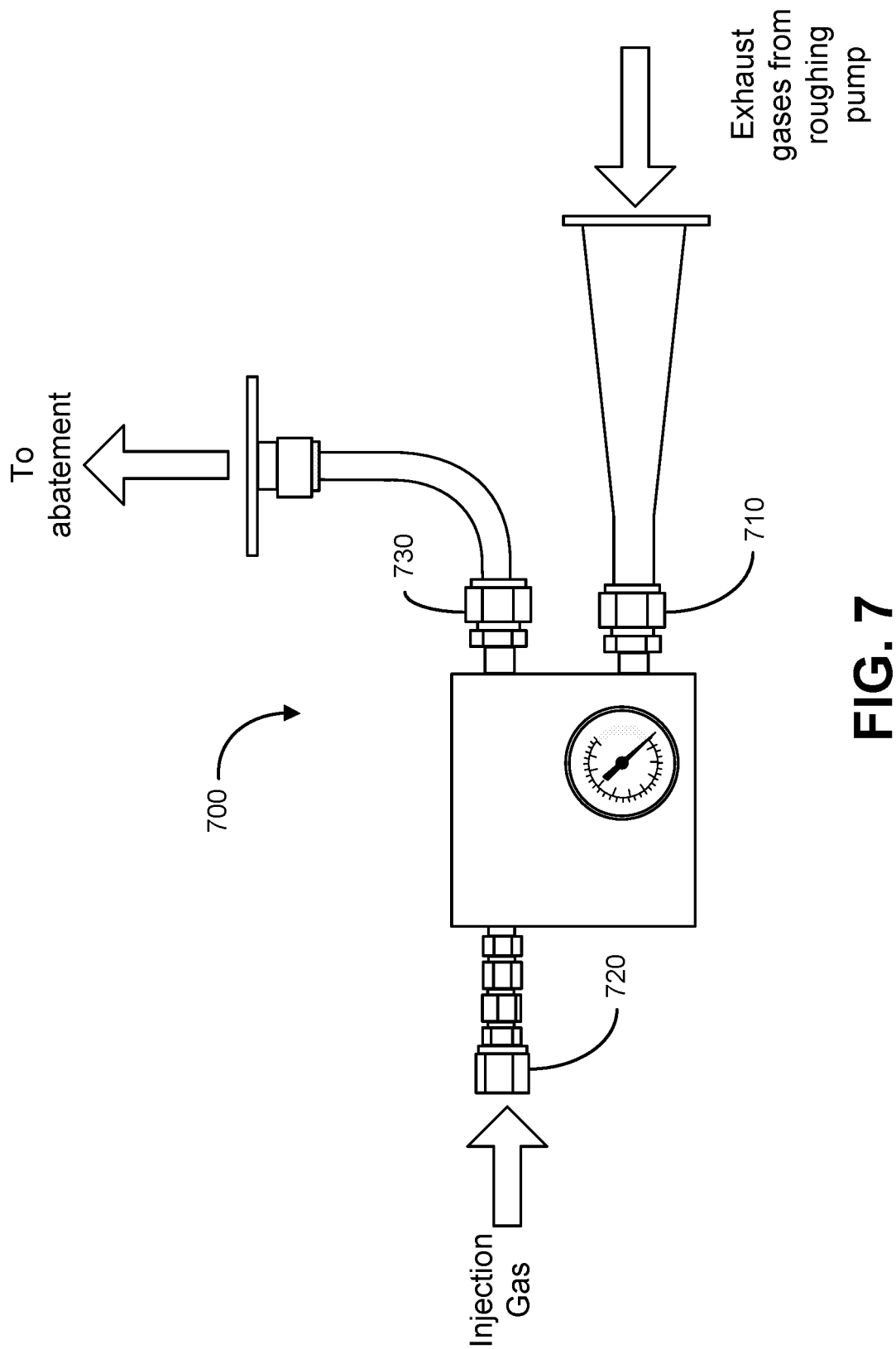
FIG. 7 shows an example venturi pump with components configured to connect to a vacuum pump system according to some implementations.

In some implementations, a venturi pump may be adapted with connectors or parts for installment with pump equipment of a semiconductor processing apparatus. In some implementations, the venturi pump may be between an abatement component/system and a roughing pump, where the venturi pump is positioned downstream of the roughing pump and upstream of the abatement component/system. FIG. 7 shows an example venturi pump 700 with components configured to connect to a vacuum pump system according to some implementations. In FIG. 7, a first connector 710 serves to connect the venturi pump 700 to an outlet of a roughing pump (not shown). The first connector 710 receives exhausted gases from the roughing pump, where the exhausted gases may include vented deposition precursors and etch gases of the processing apparatus. A second connector 720 serves to receive injection gas as motive flow at a high inlet pressure. The injection gas is provided through a body of the venturi pump 700. The injection gas mixes with the exhaust gases of the roughing pump received from the first connector 710. In some implementations, the injection gas includes an inert gas such as helium (He), $N_2$, or clean dry air. A third connector 730 provides connection to an abatement component to treat gases discharged from the venturi pump 700. Such gases may include, for example, the injection gas (e.g., $N_2$), the deposition precursors (e.g., amino-silanes), etch gases (e.g., HBr), purge gas, and reactive gases (e.g., $CH_2F_2$, $CF_4$, $Cl_2$, $SiCl_4$, $NF_3$, $O_2$, $O_3$, etc.) that may be used during wafer processing and/or cleaning operations. Thus, a venturi pump 700 may be provided with one or more connectors for connecting to a roughing pump of a semiconductor processing apparatus such as an ALD processing apparatus, and for connecting to a facilities abatement component/system. With the venturi pump 700, the exhaust gases from the roughing pump are received at a reduced pressure and discharged from the venturi pump 700 at an increased pressure. The venturi pump 700 serves to efficiently exhaust gases away from moving parts of the roughing pump and to prevent deposition in the roughing pump.

Figure 8A:
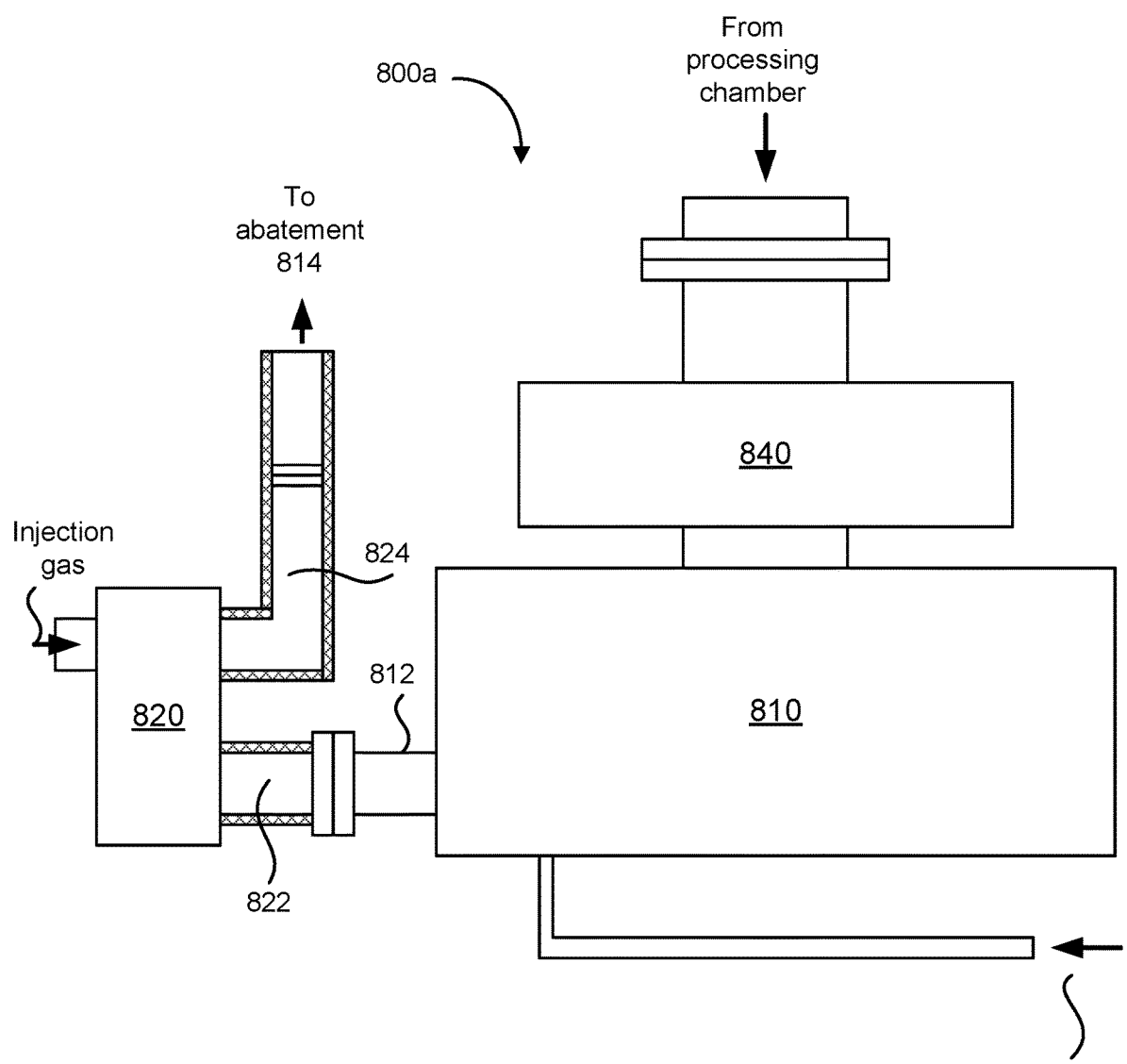
FIG. 8A shows a schematic diagram of an example vacuum pump system including a roughing pump and modified to be connected in series with a gas ejector according to some implementations.

FIG. 8A shows a schematic diagram of an example vacuum pump system 800a including a roughing pump 810 modified to be connected in series with a gas ejector according to some implementations. In some implementations, the gas ejector includes one or more venturi pumps 820. The vacuum pump system 800 includes a roughing pump 810. In some implementations, the roughing pump 810 may be combined with an optional booster pump 840 or may optionally include a booster pump 840. Deposition precursors and etch gases may be exhausted from a processing chamber through the roughing pump 810. The roughing pump 810 may include one or more moving parts, where the one or more moving parts can include rotor components. In some implementations, purge gas 830 such as $N_2$ may be provided to flow through the roughing pump 810 and vent the roughing pump 810 of the deposition precursors and the etch gases. The vented deposition precursors and etch gases may exit the roughing pump 810 at an outlet 812 of the roughing pump 810. The outlet 812 of the roughing pump 810 may be a discharge port.

One or more venturi pumps 820 may be connected to the outlet 812 or discharge port of the roughing pump 810. In some implementations, a suction port 822 leading to a low pressure zone of the one or more venturi pumps 820 may be connected to the outlet 812 of the roughing pump 810. The one or more venturi pumps 820 are connected in series with the roughing pump 810 and positioned downstream of the roughing pump 810. The one or more venturi pumps 820 are configured to reduce a pressure at the outlet 812 of the roughing pump 810. Ordinarily, deposition precursors and etch gases are exhausted from the roughing pump 810 at an exhaust pressure that is about atmospheric pressure or near-atmospheric pressure. With the one or more venturi pumps 820, the exhaust pressure at the outlet 812 of the roughing pump 810 is reduced to be significantly less than atmospheric pressure. For example, the exhaust pressure at the outlet 812 of the roughing pump 810 is equal to or less than about 380 Torr, equal to or less than about 250 Torr, or equal to or less than about 200 Torr. The reduced exhaust pressure may prevent or otherwise limit deposition byproduct formation at the outlet 812 of the roughing pump 810. In some implementations, the one or more venturi pumps 820 reduce overall pressure at various stages of the roughing pump 810 itself.

Aspects of venturi pumps described above may apply to the venturi pump 820 in FIG. 8A. A vacuum pump system in FIG. 5 may be modified to attach to one or more connectors of a venturi pump in FIG. 7 to provide the modified vacuum pump system 800a in FIG. 8A. The one or more venturi pumps 820 in FIG. 8A provide a high-pressure gas stream that creates the low pressure zone in the suction port 822, thereby resulting in suction flow that pulls in the vented deposition precursors and etch gases. Specifically, an injection gas is flowed into a body of each of the venturi pumps 820. In some implementations, the injection gas includes inert gas such as helium (He), clean dry air, or $N_2$. In some implementations, the injection gas is flowed at a pressure between about 40 psig and about 80 psig. In some implementations, the injection gas is flowed at room temperature or at an elevated temperature. For example, the injection gas is flowed at a temperature between about 20° C. and about 100° C. The injection gas may entrain and mix with the vented deposition precursors and etch gases. The mixed gases are then efficiently exhausted from the one or more venturi pumps 820 to an abatement component 814 configured to be connected to an outlet 824 of the one or more venturi pumps 820. The abatement component 814 is configured to treat the mixed gases, including the vented deposition precursors and etch gases. Taking advantage of the venturi effect described above, an exhaust pressure at the outlet 824 of the one or more venturi pumps 820 may be greater than an exhaust pressure at the outlet 812 of the roughing pump 810, where the exhaust pressure at the outlet 824 of the venturi pump 820 may be at atmospheric or near-atmospheric pressure. For example, the exhaust pressure at the outlet 824 of the one or more venturi pumps 820 is equal to or greater than about 525 Torr, equal to or greater than about 600 Torr, equal to or greater than about 700 Torr, or equal to or greater than about 760 Torr.

Figure 8B:
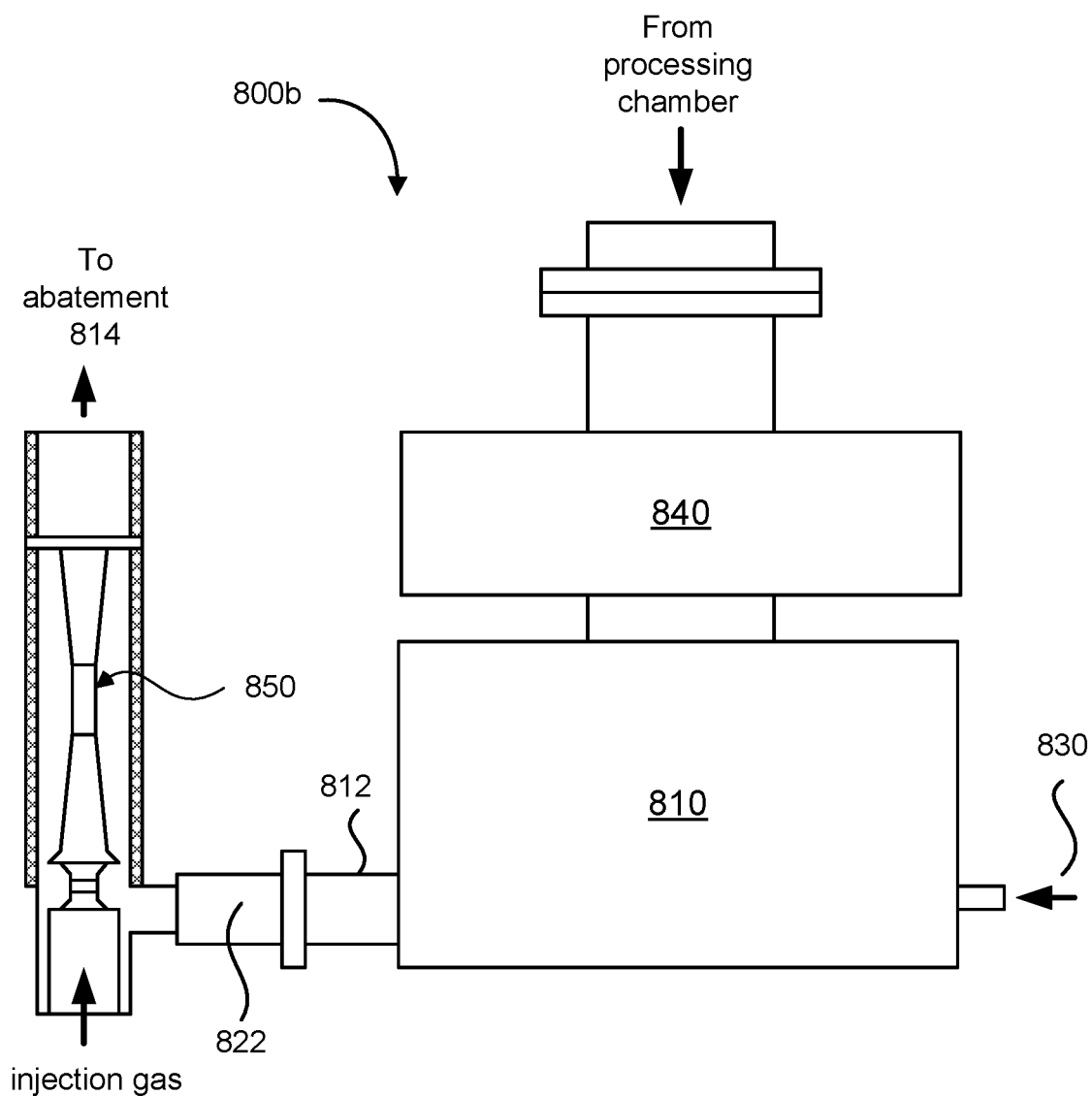
FIG. 8B shows a schematic diagram of an example vacuum pump system including a roughing pump connected in series with a gas ejector according to some implementations.

Other designs or implementations of a vacuum pump system may incorporate a gas ejector such as a venturi pump into a vacuum pump system. FIG. 8B shows a schematic diagram of an example vacuum pump system 800b including a roughing pump 810 connected in series with a gas ejector according to some implementations. The gas ejector may be a venturi pump 850. The vacuum pump system 800b includes a roughing pump 810 and optionally includes a booster pump 840 as described above. In FIG. 8B, the venturi pump 850 includes a body, where the body includes a converging motive section, a diverging discharge section, and a venturi gap between the converging motive section and the diverging discharge section. Deposition precursors and etch gases are vented to an outlet 812 of the roughing pump 810, which is connected to a suction port 822 of the venturi pump 850. The vented deposition precursors and etch gases are then pulled from the suction port 822 to the converging motive section of the venturi pump 850. A high-pressure gas stream is introduced by injecting an injection gas to the converging motive section. The injection gas mixes with the vented deposition precursors and etch gases at the converging motive section, and the mixed gases flow through the venturi gap and discharges at the diverging discharge section. In some implementations, the venturi pump 850 includes a corrosion-resistant material or is coated with a corrosion-resistant material. That way, the venturi pump 850 is protected from harsh chemistries that are involved in a plasma etch process.

Figure 8C:
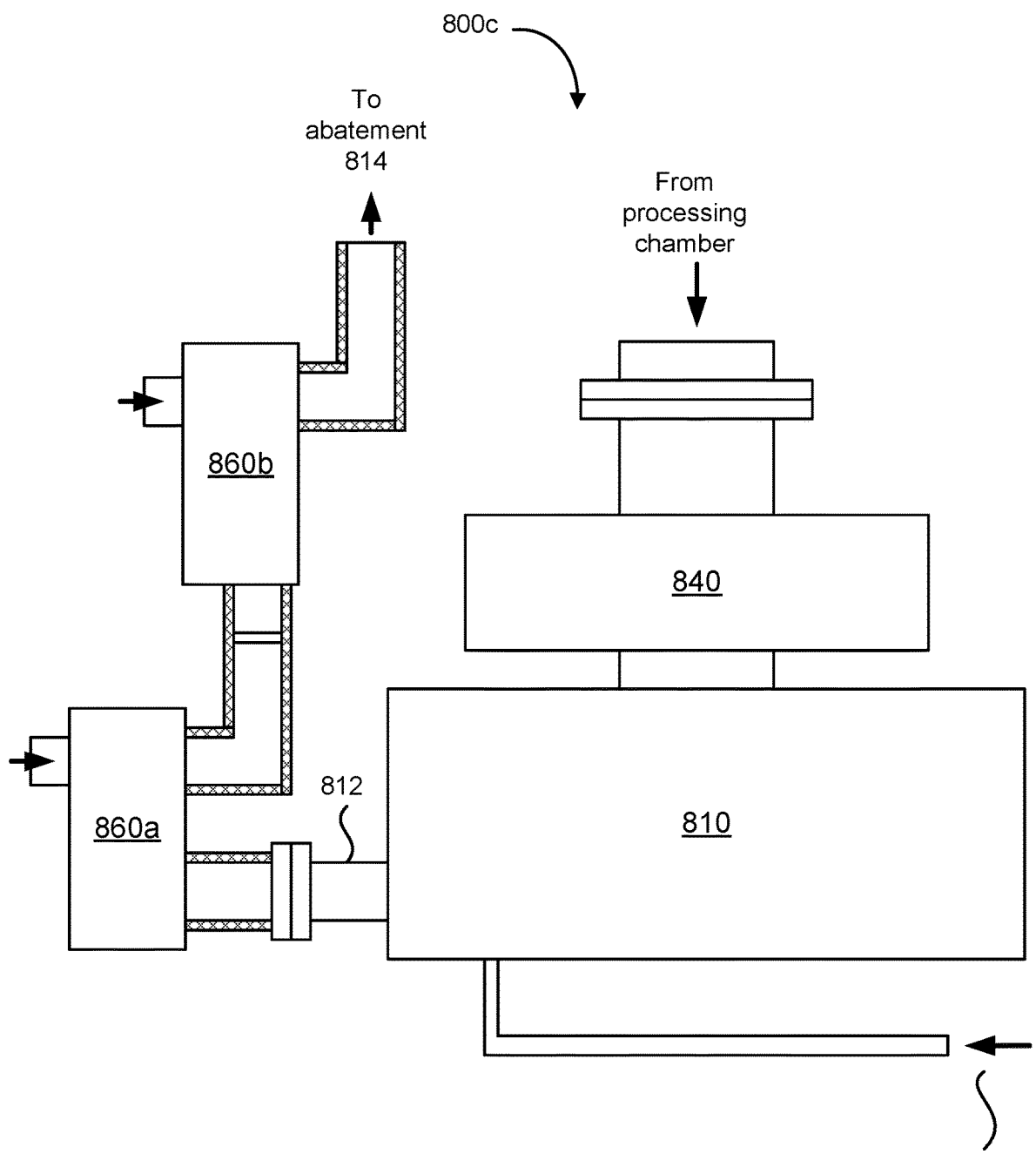
FIG. 8C shows a schematic diagram of an example vacuum pump system including a roughing pump connected in series with a plurality of gas ejectors according to some implementations.

FIG. 8C shows a schematic diagram of an example vacuum pump system 800c including a roughing pump 810 connected in series with a plurality of gas ejectors 860a, 860b according to some implementations. The plurality of gas ejectors 860a, 860b may provide multiple stages of gas ejectors that may be connected in series or in parallel with one another. The plurality of gas ejectors 860a, 860b may serve to further reduce exhaust pressure at an outlet 812 of a roughing pump 810. Moreover, the plurality of gas ejectors 860a, 860b may serve to further increase suction flow at the outlet 812 of the roughing pump 810 so that vented deposition precursors and etch gases may be efficiently exhausted from the roughing pump 810.

Incorporating one or more gas ejectors or venturi pumps in a backing pump may prevent deposition byproduct buildup in the vacuum pump system. Embodiments using such gas ejectors may be combined with one or more aforementioned embodiments for preventing deposition byproduct buildup, including embodiments involving separate pumps, separate inlets, surface coatings, pump heating, longer and more accurately measured purge times, and clean chemistries. In one example, reactive gases such as plasma-activated species of fluorine, chlorine, oxygen, ozone, or combinations thereof may be flowed through the roughing pump in a cleaning operation, where the reactive gases are vented along with remaining deposition precursors and etch gases at an outlet of a primary pump connected to the one or more venturi pumps. In another example, surfaces of pump components may be heated to an elevated temperature while the pump components vent deposition precursors and etch gases at an outlet of a primary pump connected to one or more venturi pumps.

FIG. 9 shows a schematic diagram of an example vacuum pump 900 system including a plurality of venturi pumps 920a, 920b, and 920c operating as a multi-stage venturi backing pump 910 of the vacuum pump system 900 according to some implementations. A vacuum pump system 900 includes a multi-stage venturi backing pump 910 that replaces a roughing pump. The multi-stage venturi backing pump 910 includes a plurality of venturi pumps 920a, 920b, and 920c connected in series. The multi-stage venturi backing pump 910 functionally serves as an effective roughing pump and is fluidly coupled to a turbomolecular pump 930.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A vacuum pump system for exhausting one or more etch gases and one or more deposition gases from a processing chamber, the vacuum pump system comprising:
   a roughing pump through which deposition precursors and etch gases are exhausted from the processing chamber, wherein the roughing pump comprises one or more shafts supporting one or more rotor components, each shaft having a channel for receiving a heat source, wherein the heat source includes an electrical wire, a heat lamp, or a hot fluid; and
   a system controller configured with instructions to perform the following operations:
      exhaust the deposition precursors or etch gases from the processing chamber; and
      heat internal surfaces of the one or more shafts and the one or more rotor components to an elevated temperature using the heat source while exhausting the deposition precursors or etch gases.

2. The vacuum pump system of claim 1, wherein the elevated temperature is equal to or greater than about 160° C.

3. The vacuum pump system of claim 1, wherein the elevated temperature is sufficient to prevent deposition byproduct buildup as a result of reactions between the etch gases and the deposition gases.

4. The vacuum pump system of claim 1, wherein the system controller configured with instructions to heat internal surfaces is configured with instructions to draw thermal energy from a reservoir outside the vacuum pump system and transfer the thermal energy to the internal surfaces by radiation and/or conduction.

5. The vacuum pump system of claim 1, wherein the etch gases include hydrogen bromide and the deposition precursors include amino-silane precursors.

6. The vacuum pump system of claim 1, wherein the roughing pump further comprises:
   a stator component enclosing the one or more rotor components of the roughing pump, wherein the deposition precursors and etch gases pass through a passage in a stator component.

7. The vacuum pump system of claim 1, wherein each of the one or more shafts includes an inner conductive material and an outer insulating material.

8. A vacuum pump system for exhausting one or more etch gases and one or more deposition gases from a processing chamber, the vacuum pump system comprising: a roughing pump through which deposition precursors and etch gases are exhausted from the processing chamber, wherein the roughing pump comprises one or more shafts supporting one or more rotor components; a system controller configured with instructions to perform the following operations: exhaust the deposition precursors or etch gases from the processing chamber; and heat surfaces of the one or more shafts and the one or more rotor components to an elevated temperature by flowing heated purge gas, via an internal channel in the one or more shafts, across the surfaces of the one or more shafts and the one or more rotor components.

9. The vacuum pump system of claim 8, wherein the elevated temperature is equal to or greater than about 160° C.

10. The vacuum pump system of claim 8, wherein the system controller configured with instructions to heat surfaces is configured with instructions to flow the heated purge gas while exhausting the deposition precursors or etch gases.

11. The vacuum pump system of claim 8, wherein the system controller is configured with instructions to perform the following operations:
   exhaust the deposition precursors from the processing chamber via a passage in the roughing pump; and
   exhaust the etch gases from the processing chamber via the passage in the roughing pump, wherein flowing the heated purge gas occurs in between operations of exhausting the deposition precursors and exhausting the etch gases.

* * * * *